United States Patent
Chang et al.

(10) Patent No.: US 10,108,054 B2
(45) Date of Patent: Oct. 23, 2018

(54) LIQUID CRYSTAL DISPLAY DEVICE

(71) Applicant: Samsung Display Co. Ltd., Yongin-si (KR)

(72) Inventors: Hak Sun Chang, Yongin-si (KR); Cheol Shin, Hwaseong-si (KR); Ki Chul Shin, Seongnam-si (KR); Se Hyun Lee, Seoul (KR); Yun Seok Lee, Seoul (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 15/415,295

(22) Filed: Jan. 25, 2017

(65) Prior Publication Data

US 2017/0242306 A1    Aug. 24, 2017

(30) Foreign Application Priority Data

Feb. 23, 2016 (KR) ........................ 10-2016-0021009

(51) Int. Cl.
| | |
|---|---|
| *H01L 27/00* | (2006.01) |
| *G02F 1/1343* | (2006.01) |
| *G02F 1/1362* | (2006.01) |
| *H01L 27/12* | (2006.01) |
| *H01L 29/786* | (2006.01) |
| *H01L 27/32* | (2006.01) |

(52) U.S. Cl.
CPC .... *G02F 1/134309* (2013.01); *G02F 1/13439* (2013.01); *G02F 1/136286* (2013.01); *H01L 27/124* (2013.01); *H01L 27/326* (2013.01); *H01L 27/3244* (2013.01); *H01L 27/3246* (2013.01); *H01L 27/3251* (2013.01); *H01L 27/3276* (2013.01); *H01L 29/78633* (2013.01); *G02F 2001/134372* (2013.01); *G02F 2001/136218* (2013.01); *G02F 2201/121* (2013.01); *G02F 2201/123* (2013.01); *H01L 27/3248* (2013.01)

(58) Field of Classification Search
CPC ............... H01L 27/124; H01L 27/3276; H01L 27/3246; H01L 27/3248; H01L 27/3244; H01L 27/326; H01L 27/3251
See application file for complete search history.

(56) References Cited

U.S. PATENT DOCUMENTS

| | | | |
|---|---|---|---|
| 2008/0094558 A1 | 4/2008 | Wang et al. | |
| 2009/0260738 A1 | 10/2009 | Kitada et al. | |
| 2009/0279010 A1* | 11/2009 | Kim | G02F 1/133753 349/46 |
| 2012/0249902 A1* | 10/2012 | Seok | G02F 1/133753 349/33 |
| 2013/0009930 A1* | 1/2013 | Cho | G09G 3/2003 345/211 |

(Continued)

*Primary Examiner* — Ngan Ngo
(74) *Attorney, Agent, or Firm* — Cantor Colburn LLP

(57) ABSTRACT

A liquid crystal display device includes a base unit, a gate line disposed on the base unit, a data line disposed on the base unit and crossing the gate line while being insulated from the gate line, a shielding electrode disposed on the data line and overlapping the data line and isolated from the pixel electrode and a conductive bar, the conductive bar disposed on the same layer as that on which the shielding electrode is disposed, isolated from the shielding electrode, and extending in parallel to the data line.

20 Claims, 35 Drawing Sheets

(56) References Cited

U.S. PATENT DOCUMENTS

| | | | | |
|---|---|---|---|---|
| 2013/0321483 A1* | 12/2013 | You | .......................... | G09G 5/10 |
| | | | | 345/690 |
| 2014/0028925 A1* | 1/2014 | Choi | ................... | G02F 1/13338 |
| | | | | 349/12 |
| 2014/0043571 A1* | 2/2014 | Chang | .................... | G02F 1/139 |
| | | | | 349/123 |
| 2014/0104547 A1* | 4/2014 | Kuo | .................. | G02F 1/133707 |
| | | | | 349/106 |
| 2014/0267994 A1* | 9/2014 | Ryu | .................... | G02F 1/13439 |
| | | | | 349/141 |
| 2016/0216578 A1* | 7/2016 | Lee | ....................... | G02F 1/1362 |
| 2016/0342040 A1* | 11/2016 | Lee | .................. | G02F 1/133707 |
| 2017/0242289 A1* | 8/2017 | Lee | .................. | G02F 1/133377 |
| 2017/0293185 A1* | 10/2017 | Park | .................. | G02F 1/134309 |
| 2017/0315411 A1* | 11/2017 | Shin | .................. | G02F 1/134309 |
| 2017/0322462 A1* | 11/2017 | Lee | .................. | G02F 1/133345 |

* cited by examiner

LIQUID CRYSTAL DISPLAY DEVICE

This application claims priority to Korean Patent Application No. 10-2016-0021009, filed on Feb. 23, 2016, and all the benefits accruing therefrom under 35 U.S.C. § 119, the content of which in its entirety is herein incorporated by reference.

BACKGROUND

1. Field

Exemplary embodiments of the invention relate to a liquid crystal display ("LCD") device.

2. Description of the Related Art

A liquid crystal display ("LCD") device, which is one of the most widely-used display devices, generally includes two substrates on which field-generating electrodes such as pixel electrodes and a common electrode are formed and a liquid crystal layer which is interposed between the two substrates. The LCD device displays an image by applying voltages to the field-generating electrodes to generate an electric field in the liquid crystal layer, which determines an orientation of liquid crystal molecules in the liquid crystal layer to adjust a polarization of an incident light.

An example of the LCD device is a vertical alignment ("VA")-mode LCD device, which aligns liquid crystal molecules such that long axes of the liquid crystal molecules are perpendicular to upper and lower panels when an electric field is not generated. The VA-mode LCD device has been highlighted due to its high contrast ratio and wide reference viewing angle.

SUMMARY

To realize a wide viewing angle in the VA-mode liquid crystal display ("LCD") device, a plurality of domains that differ from one another in terms of the alignment direction of liquid crystal molecules may be provided in each pixel.

There is a method of forming a plurality of domains in each pixel of an LCD device by defining cutouts such as slits on field-generating electrodes such as pixel electrodes. According to this method, a plurality of domains may be provided by realigning liquid crystal molecules using a fringe field generated between the edges of the cutouts and the field-generating electrodes.

Exemplary embodiments of the invention provide an LCD device which improves transmittance by controlling a fringe field at the edges of each pixel electrode.

Exemplary embodiments of the invention also provide an LCD device which improves side visibility.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, there is provided an LCD device. The LCD device includes a base unit, a pixel electrode disposed on the base unit and including a stem and a plurality of branches, which extend from the stem, a first conductive bar extending along a first edge of the pixel electrode and isolated from the first edge, a first connector connecting the pixel electrode and the first conductive bar, and a common electrode overlapping the pixel electrode and having a planar shape.

According to another exemplary embodiment of the invention, there is provided an LCD device. The LCD device includes a base unit, a gate line disposed on the base unit, a data line disposed on the base unit and crossing the gate line while being insulated from the gate line, a shielding electrode disposed on the data line and overlapping the data line and isolated from the pixel electrode and a conductive bar, the conductive bar disposed on the same layer as that on which the shielding electrode is disposed, isolated from the shielding electrode, and extending in parallel to the data line.

According to the exemplary embodiments, the LCD device with improved transmittance may be provided.

Also, the LCD device with improved side visibility may be provided.

Other features and exemplary embodiments will be apparent from the following detailed description, the drawings, and the claims.

DETAILED DESCRIPTION

Figure 1:
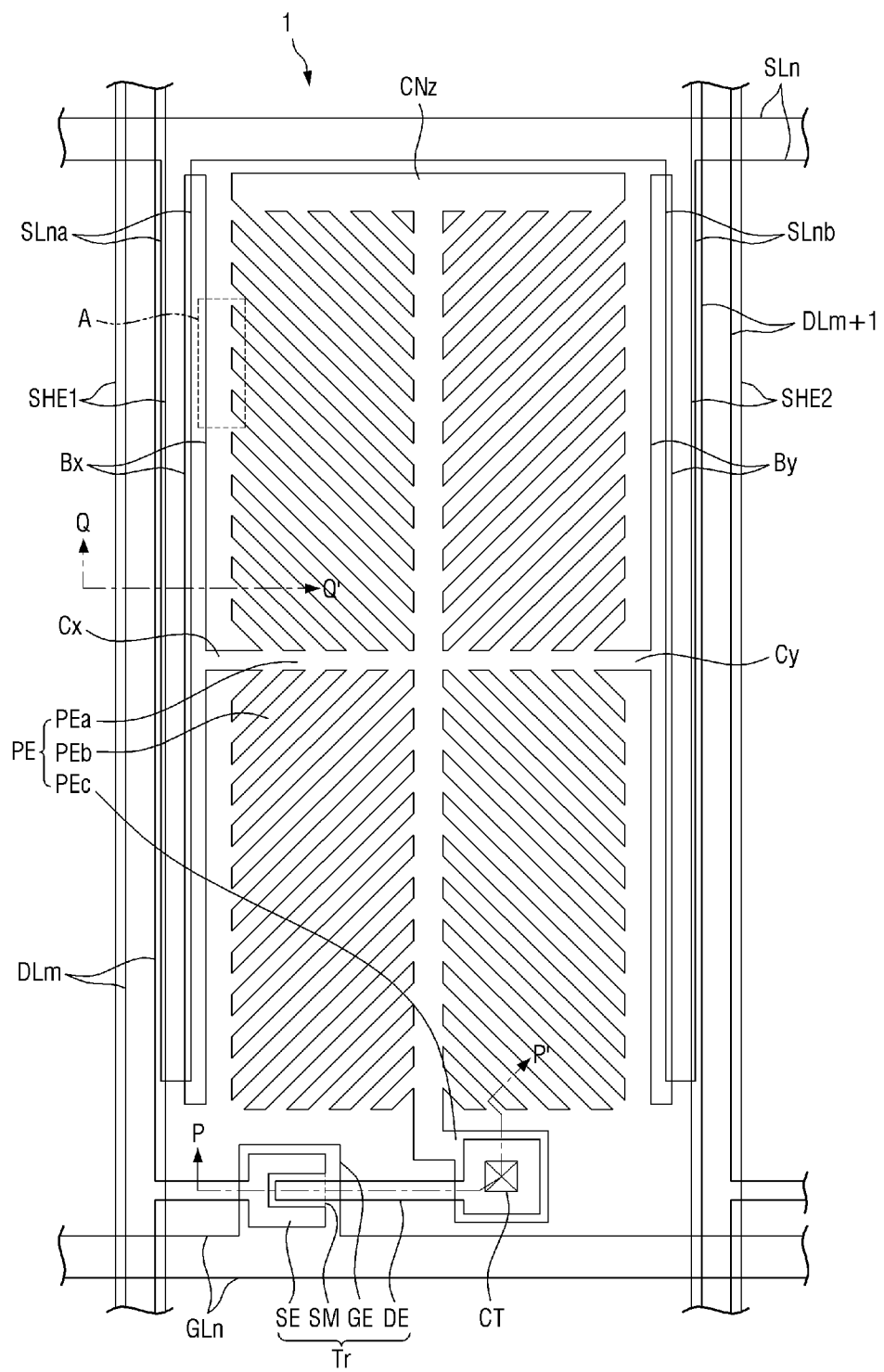
FIG. 1 is a schematic plan view of an exemplary embodiment of an array substrate, e.g., a pixel of the array substrate, included in a liquid crystal display ("LCD") device according to invention.

Features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Unless otherwise defined, all terms (including technical and scientific terms) used herein have the same meaning as commonly understood by one of ordinary skill in the art to which the application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the drawings, identical or similar parts or elements are indicated by the same reference numerals.

Exemplary embodiments of the invention will hereinafter be described with reference to the accompanying drawings.

Figure 2:
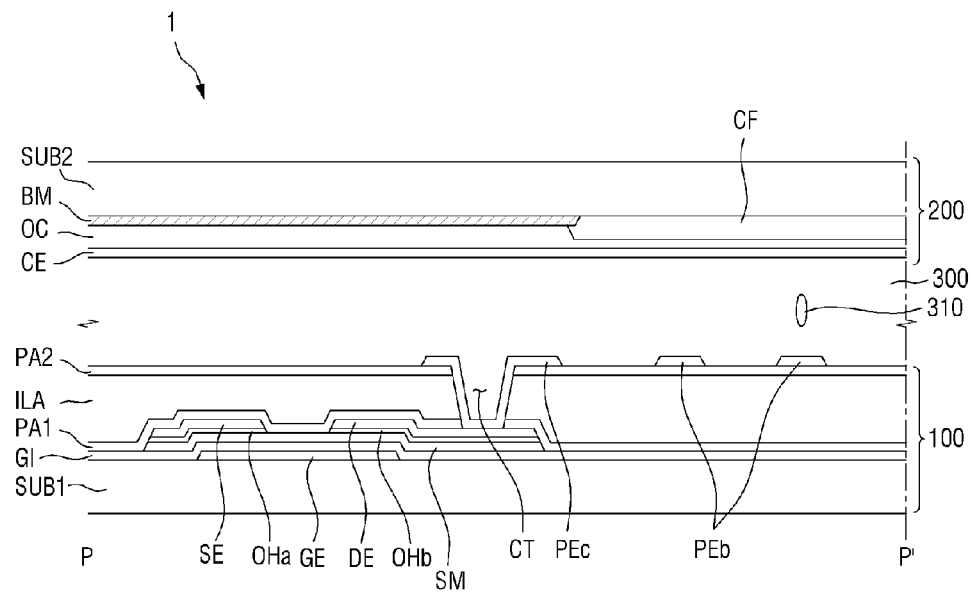
FIG. 2 is a schematic cross-sectional view taken along line P-P' of FIG. 1.
Figure 3:
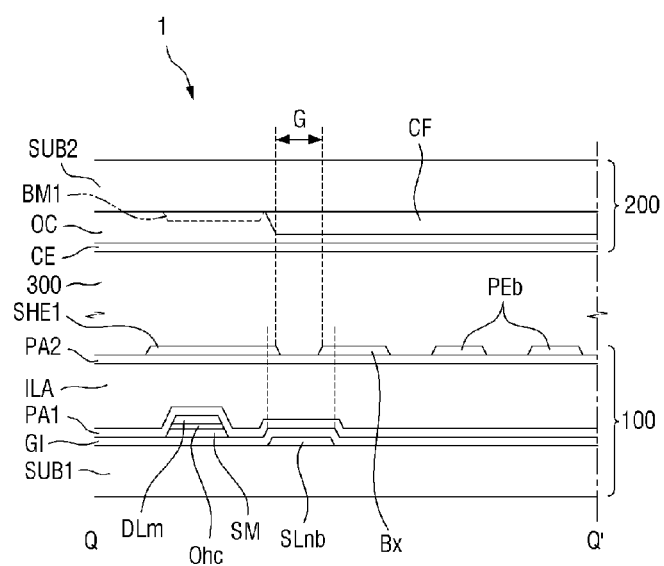
FIG. 3 is a schematic cross-sectional view taken along line Q-Q' of FIG. 1.
Figure 4:
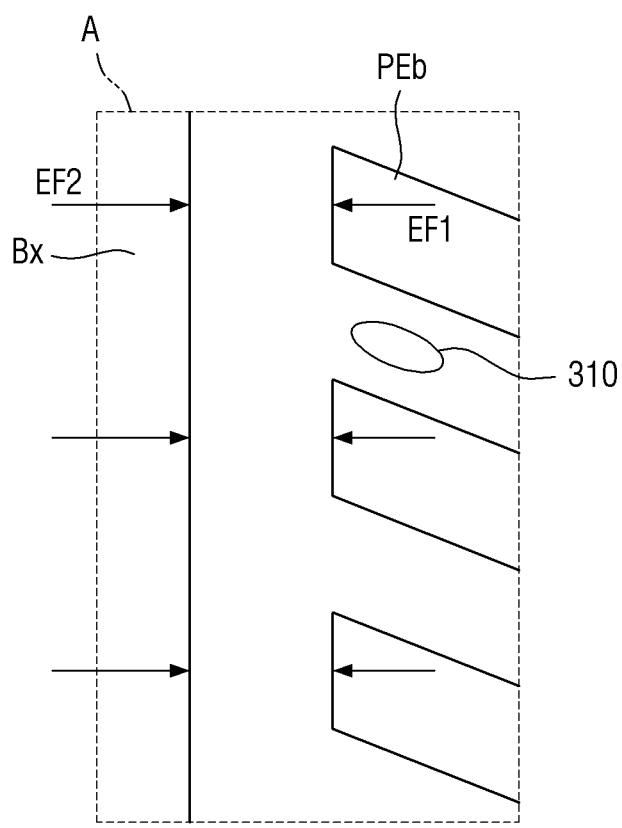
FIG. 4 is an enlarged view of a portion A of FIG. 1.
Figure 5:
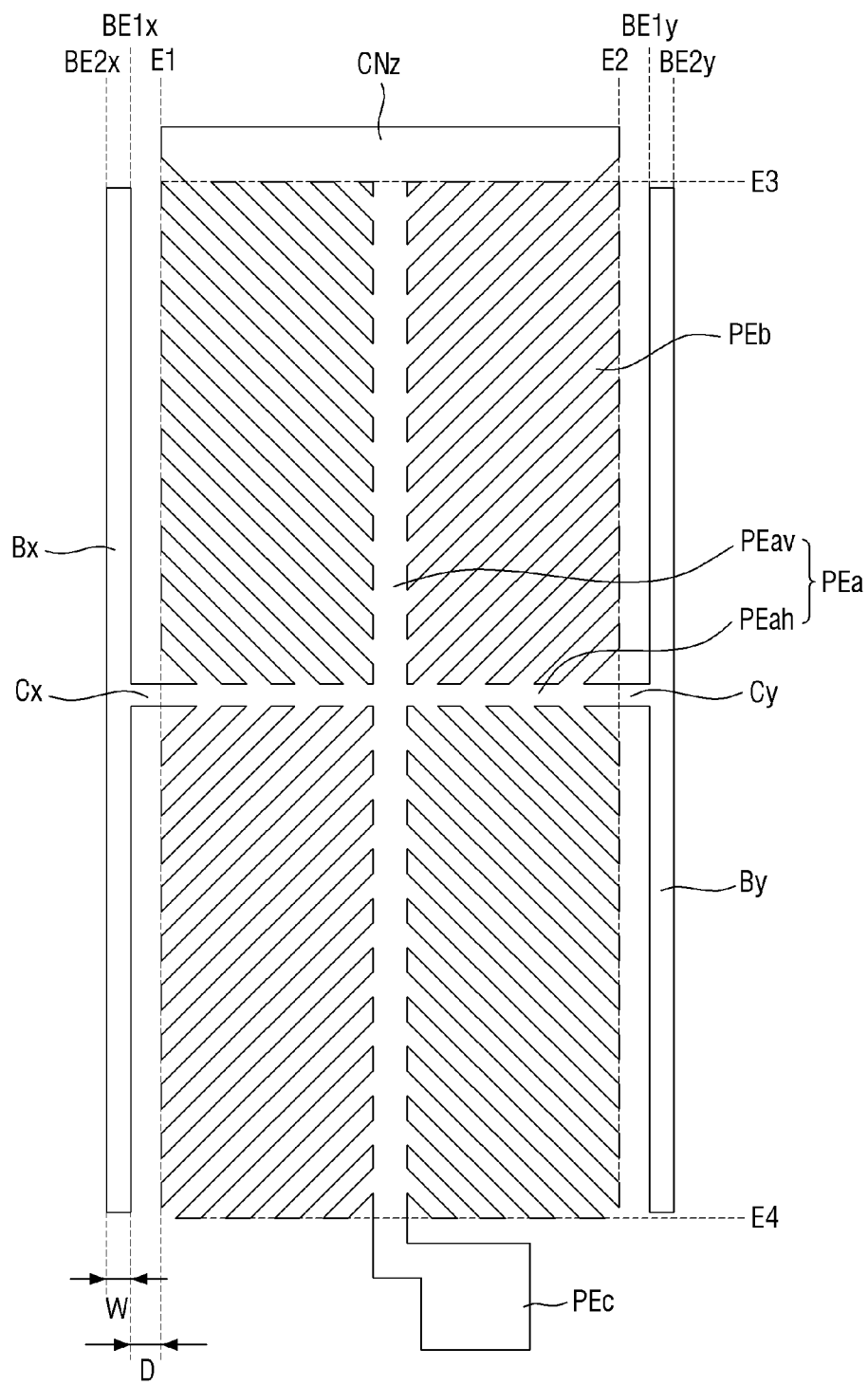
FIG. 5 is a schematic plan view illustrating a pixel electrode and bar-type conductors of FIG. 1.

FIG. 1 is a schematic plan view of an array substrate included in a liquid crystal display ("LCD") device according to an exemplary embodiment of the invention, and particularly, a pixel of the array substrate, FIG. 2 is a schematic cross-sectional view taken along line P-P' of FIG. 1, FIG. 3 is a schematic cross-sectional view taken along line Q-Q' of FIG. 1, FIG. 4 is an enlarged view of a portion A of FIG. 1, FIG. 5 is a schematic plan view illustrating a pixel electrode and bar-type conductors of FIG. 1, and FIGS. 6 through 27 are schematic plan views of various modifications of the bar-type conductors of the LCD device according to the exemplary embodiment of FIG. 1.

Referring to FIGS. 1 through 5, an LCD device 1 may include an array substrate 100, a counter substrate 200, which faces the array substrate 100, and a liquid crystal layer 300, which is disposed between the array substrate 200 and the counter substrate 200, and may further include a pair of polarizers (not illustrated), which are respectively attached on the outer surfaces of the array substrate 100 and the counter substrate 200.

In an exemplary embodiment, the array substrate 100 may be a thin-film transistor ("TFT") array substrate on which switching devices for driving liquid crystal molecules, for example, TFTs, are disposed, and the counter substrate 200 may be a substrate facing the array substrate 100.

The liquid crystal layer 300 may include a plurality of liquid crystal molecules 310, which have dielectric anisotropy. In response to an electric field being applied between the array substrate 100 and the counter substrate 200, the liquid crystal molecules 310 may rotate in a particular direction between the array substrate 100 and the counter substrate 200 so as to either allow or block the transmission of light. The term "rotate" or "rotation", as used herein, may not only include actual physical rotation of the liquid crystal molecules 310, but also include change of the alignment of the liquid crystal molecules 310 due to an electric field.

The array substrate 100 will hereinafter be described.

A first base unit SUB1 may include an insulating substrate, and the insulating substrate may be transparent. In an exemplary embodiment, the first base unit SUB1 may include a glass substrate, a quartz substrate, or a transparent resin substrate, for example. In an exemplary embodiment, the first base unit SUB1 may comprise a polymer or a plastic material having high thermal resistance. In exemplary embodiments, the first base unit SUB1 may have flexibility. That is, the first base unit SUB1 may be a substrate that may be deformed by rolling, folding or bending. In exemplary embodiments, the first base substrate SUB1 may have a structure in which additional layers such as an insulating layer are stacked on an insulating substrate.

A gate line GLn and a gate electrode GE may be disposed on the first base unit SUB1. The gate line GLn may transmit a gate signal and may extend substantially in a first direction (e.g., a horizontal direction). The gate electrode GE may protrude from, and may be connected to, the gate line GLn. In an exemplary embodiment, the gate line GLn and the gate electrode GE may include an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), tantalum (Ta), titanium (Ti), or the like. In an exemplary embodiment, each of the gate line GLn and the gate electrode GE may have a single-layer structure or may have a multilayer structure including two conductive films having different physical properties, where one of the two conductive films may include a low-resistance metal, for example, an Al-based metal, an Ag-based metal, a Cu-based metal, or the like, so as to reduce signal delays or voltage drops in the gate wiring (GLn and GE), and another conductive film may include a material with excellent contact properties with respect to indium tin oxide ("ITO") and indium zinc oxide ("IZO"), such as a Mo-based metal, Cr, Ti, Ta, or the like. Examples of the multilayer structure of each of the gate line GLn and the gate electrode GE include the combination of a Cr lower film and an Al upper film and the combination of an Al lower film and a Mo upper film, but the invention is not limited thereto. That is, the gate line GLn and the gate electrode GE may be provided using various metals and conductors other than those set forth herein.

A gate insulating layer GI may be disposed on the gate line GLn and the gate electrode GE. In an exemplary embodiment, the gate insulating layer GI may include an insulating material, for example, an inorganic insulating material such as silicon nitride, silicon oxide, or silicon oxynitride, for example. The gate insulating layer GI may have a single-layer structure or may have a multilayer structure including two insulating films having different physical properties.

A semiconductor layer SM may be disposed on the gate insulating layer GI and may partially overlap the gate electrode GE. In an exemplary embodiment, the semiconductor layer SM may comprise amorphous silicon, polycrystalline silicon, or an oxide semiconductor, for example.

A plurality of ohmic contact members (Oha, Ohb, and Ohc) may be disposed on the semiconductor layer SM. The ohmic contact members (Oha, Ohb, and Ohc) may include a source ohmic contact member Oha, which is disposed below a source electrode SE that will be described later, a drain ohmic contact member Ohb, which is disposed below a drain electrode DE, and a data ohmic contact member Ohc, which is disposed below data lines (DLm and DLm+1). In an exemplary embodiment, the ohmic contact members (Oha, Ohb, and Ohc) may include n+ hydrogenated amorphous silicon doped with a high concentration of n-type impurities, or silicide, for example.

In exemplary embodiments, when the semiconductor layer SM comprises an oxide semiconductor, the ohmic contact members (Oha, Ohb, and Ohc) may not be provided.

The source electrode SE, the drain electrode DE, and the data lines (DLm and DLm+1) may be disposed on the ohmic contact members (Oha, Ohb, and Ohc) and the gate insulating layer GI. The data lines (DLm and DLm+1) may transmit data signals and may extend substantially in a second direction (e.g., a vertical direction), which intersects the first direction, to cross the gate line GLn. For convenience, the data line DLm disposed on the left side of a pixel electrode PE will hereinafter be referred to as a first data line DLm, and the data line DLm+1 disposed on the right side of the pixel electrode PE will hereinafter be referred to as a second data line DLm+1.

The source electrode SE may be connected to the first data line DLm and may protrude from the first data line DLm to the top of the gate electrode GE. In exemplary embodiments, a part of the source electrode SE above the gate electrode GE may be bent in a C shape, but the invention is not limited thereto. That is, the shape of the source electrode SE may vary.

The drain electrode DE faces the source electrode SE. The drain electrode DE may include a bar-shaped portion, which extends substantially in parallel to the source electrode SE, and an extended portion, which is disposed on the opposite side of the bar-shaped portion. The drain electrode DE and the source electrode SE may contact the semiconductor layer SM and may be disposed on the semiconductor layer SM to be isolated from each other.

In an exemplary embodiment, the data lines (DLm and DLm+1), the source electrode SE, and the drain electrode DE may include Al, Cu, Ag, Mo, Cr, Ti, Ta, or an alloy thereof and may each have a multilayer structure including a lower film (not illustrated) including a refractory metal and a low-resistance upper film (not illustrated) disposed on the lower film, but the invention is not limited thereto.

The gate electrode GE, the source electrode SE, and the drain electrode DE may provide a TFT Tr, which is a switching device, together with the semiconductor layer SM.

A first passivation layer PA1 may be disposed on the gate electrode GE, the semiconductor layer SM, the source electrode SE, and the drain electrode DE. The first passivation layer PA1 may include an organic insulating material or an inorganic insulating material. The first passivation layer PA1 may protect the TFT Tr and may prevent a material included in an organic layer ILA that will be described later from infiltrating into the semiconductor layer SM.

The organic layer ILA may be disposed on the first passivation layer PA1. In exemplary embodiments, the organic layer ILA may have a function of planarizing the top of the first passivation layer PA1. The organic layer ILA may comprise an organic material. In exemplary embodiments, the organic material may be a photosensitive organic material.

In other exemplary embodiments, the organic layer ILA may not be provided. In other exemplary embodiments, the organic layer ILA may be a color filter. The color filter may display, but is not limited to, one of three primary colors such as red, green, and blue. In an alternative exemplary embodiment, the color filter may display one of cyan, magenta, yellow, and white (or a whitish color). In the following description, it is assumed that the organic layer ILA is a color filter, but the invention is not limited thereto.

A second passivation layer PA2 may be disposed on the organic layer ILA. In an exemplary embodiment, the second passivation layer PA2 may comprise an inorganic insulating material such as silicon oxide, silicon nitride, or silicon oxynitride. The second passivation layer PA2 may prevent the organic layer ILA from being lifted off from the underlying layer and may suppress the contamination of the liquid crystal layer 300 by an organic material such as a solvent from the organic layer ILA.

A contact hole CT, which exposes a part of the drain electrode DE, may be defined in the first passivation layer PA1, the organic layer ILA, and the second passivation layer PA2.

The pixel electrode PE may be disposed on the second passivation layer PA2. The pixel electrode PE may be electrically connected to the TFT Tr by contacting the drain electrode DE via the contact hole CT. In an exemplary embodiment, the pixel electrode PE may include a transparent conductive material such as, for example, ITO, IZO, indium tin zinc oxide ("ITZO"), or aluminum-doped zinc oxide ("AZO"), or a reflective metal such as Al, Ag, Cr, or an alloy thereof. In exemplary embodiments, the planar shape of the pixel electrode PE may be substantially rectangular, for example.

The pixel electrode PE may include a stem PEa, a plurality of branches PEb, which extend outwards from the stem PEa, and a projection PEc. The pixel electrode PE may further include a branch connector CNz, which connect the ends of at least some of the branches PEb.

The branch PEa may include a horizontal stem PEah, which extends substantially in the horizontal direction, and a vertical stem PEav, which extends substantially in the vertical direction, and may divide the pixel regions PE into a plurality of sub-regions, for example, a plurality of domains. In exemplary embodiments, the horizontal stem PEah and the vertical stem PEav may intersect each other, and thus, the stem PEa may be cross-shaped. In a case in which the stem PEa is provided in the shape of a cross, the pixel electrode PE may be divided into four sub-regions, i.e., four domains. The direction in which the branches PEb extend may differ from one sub-region to another sub-region of the pixel electrode PE. In an exemplary embodiment, referring to FIGS. 1 and 5, the branches PEb may extend diagonally from the stem PEa in an upper right direction in the upper right sub-region, and may extend diagonally from the stem PEa in a lower right direction in the lower right sub-region, for example. The branches PEb may extend diagonally from the stem PEa in an upper left direction in the upper left sub-region and may extend diagonally from the stem PEa in a lower left direction in the lower left sub-region. In an exemplary embodiment, the angle defined by the direction in which the gate line GLn extends and the branches PEb, the angle defined by the horizontal stem PEah and the branches PEb, or the angle defined by the vertical stem PEav and the branches PEb may be about 45 degrees, for example, but the invention is not limited thereto.

Although not specifically illustrated, in other exemplary embodiments, the stem PEa may be provided in various shapes, other than that set forth herein, and the pixel electrode PE may be divided into one, two, or three sub-regions depending on the shape of the stem PEa, which will be described later in detail with reference to FIGS. 31 through 40.

The projection PEc may be connected to another layer and may protrude downward from the stem PEa or the branches PEb. In exemplary embodiments, the projection PEc may protrude from the stem PEa, but the invention is not limited thereto. The projection PEc is electrically connected to the drain electrode DE via the contact hole CT.

The branch connector CNz may connect the ends of at least some of the branches PEb at a side of the pixel electrode PE that does not face conductive bars (Bx and By) that will be described later. In an exemplary embodiment, when edges of the pixel electrode PE that face the conductive bars (Bx and By), respectively, are defined as first and second edges E1 and E2, respectively, an upper edge of the pixel electrode PE is defined as a third edge E3, and a bottom edge of the pixel electrode PE is defined as a fourth edge E4, the branch connector CNz may connect the ends of branches PEb that are located at the third edge E3, for example. In an alternative exemplary embodiment, differently from the exemplary embodiment illustrated in FIGS. 1 and 5, an additional branch connector CNz may be provided at the fourth edge E4 to connect the ends of branches PEb that are located at the fourth edge E4. In other exemplary embodiments, the branch connector CNz may not be provided.

The ends of some of the branches PEb that face the conductive bar Bx or By may not be connected to one another, as illustrated in FIGS. 1 and 5

In an alternative exemplary embodiment, differently from the exemplary embodiment illustrated in FIGS. 1 and 5, the ends of the branches PEb that face the conductive bars (Bx and By) may be connected to one another via one or more additional branch connectors, in which case, the conductive bars (Bx and By) may face the additional branch connectors.

FIG. 1 illustrates an example in which the horizontal width of the pixel electrode PE, i.e., the width of the pixel electrode PE in the direction in which the gate line GLn extends, is smaller than the vertical width of the pixel electrode PE, i.e., the width of the pixel electrode PE in the direction in which the data lines (DLm and DLm+1) extend, but the invention is not limited thereto. In other exemplary embodiments, the horizontal width of the pixel electrode PE, i.e., the width of the pixel electrode PE in the direction in which the gate line GLn extends, may be larger than the vertical width of the pixel electrode PE, i.e., the width of the pixel electrode PE in the direction in which the data lines (DLm and DLm+1) extend.

The conductive bars (Bx and By) and connectors (Cx and Cy) may be disposed on the second passivation layer PA2. The conductive bars (Bx and By) may be physically isolated from the pixel electrode PE, and may be disposed on the same layer as that on which the pixel electrode PE is disposed. That is, the conductive bars (Bx and By), like the pixel electrode PE, may be disposed directly on the second passivation layer PA2 and may thus directly contact the second passivation layer PA2.

The conductive bars (Bx and By), which are conductors provided in the shape of bars extending in the vertical direction or the horizontal direction, may be disposed to face the edges of the pixel electrode PE, and may extend in parallel to the pixel electrode PE while maintaining a predetermined distance from the pixel electrode PE. In an exemplary embodiment, the conductive bars (Bx and By) may extend long in the direction in which the data lines (DLm and DLm+1) extend, i.e., in the vertical direction, for example. For convenience, one of the conductive bars (Bx and By) disposed on the left of the pixel electrode PE, i.e., a conductive bar Bx facing the first edge E1 of the pixel electrode PE, will hereinafter be referred to as the first conductive bar Bx, and a conductive bar By disposed on the right side of the pixel electrode PE and facing the second edge E2 of the pixel electrode PE will hereinafter be referred to as the second conductive bar By.

The conductive bars (Bx and By) may not overlap the data lines (DLm and DLm+1). In an exemplary embodiment, the first conductive bar Bx may be disposed between the first edge E1 of the pixel electrode PE and the first data line DLm and may not overlap the first data line DLm, and the second conductive bar By may be disposed between the second edge E2 of the pixel electrode PE and the second data line DLm+1 and may not overlap the second data line DLm+1, for example.

The distance between the edges of the pixel electrode PE and the conductive bars (Bx and By) may be uniform or may vary. In exemplary embodiments, when an edge of the first conductive bar Bx facing the first edge E1 of the pixel electrode PE is defined as a first inner edge BE1x, an edge of the first conductive bar Bx on the opposite side of the first inner edge BE1x is defined as a first outer edge BE2x, an edge of the second conductive bar By facing the second edge E2 of the pixel electrode PE is defined as a second inner edge BE1y, and an edge of the second conductive bar By on the opposite side of the second inner edge BE1y is defined as a second outer edge BE2y, a distance D between the first edge E1 of the pixel electrode PE and the first inner edge BE1x of the first conductive bar Bx may be uniform, as illustrated in FIGS. 1 and 5. The distance D may be controlled in consideration of the visibility of the LCD device 1. In an exemplary embodiment, the distance D may be about 2 micrometers (μm) to about 5 μm, for example. Similarly, the distance between the second edge E2 of the pixel electrode PE and the second inner edge BE1y of the second conductive bar By may be uniform and may be about 2 μm to about 5 μm, for example.

In exemplary embodiments, one of the first and second conductive bars Bx and By may not be provided.

In an exemplary embodiment, a width W of the conductive bars (Bx and By) may be greater than 0 μm and may be less than about 10 μm, for example. The width W of the conductive bars (Bx and By) may be uniform along a lengthwise direction (or along the vertical direction) of the conductive bars (Bx and By) or may partially vary.

The shape of the conductive bars (Bx and By) is not limited to a rectangular shape as illustrated in FIGS. 1 and 5, but may vary. FIGS. 6 through 27 illustrate various modifications of the conductive bars (Bx and By). More specifically, FIGS. 6 through 13 illustrate various examples in which the inner edges (BE1x and BE1y, refer to FIG. 5) of the conductive bars (Bx and By) are parallel to the edges of the pixel electrode PE, and FIGS. 14 through 21 illustrate various examples in which the outer edges (BE2x and BE2y, refer to FIG. 5) of the conductive bars (Bx and By) are in parallel to the edges of the pixel electrode PE. FIGS. 22 through 27 illustrate various examples in which the inner edges (BE1x and BE1y) and the outer edges (BE2x and BE2y) of the conductive bars (Bx and By) are at least partially not in parallel to the edges of the pixel electrode PE. For convenience, the detailed structure of the pixel electrode PE is not illustrated in FIGS. 6 through 27.

Various modifications of the conductive bars (Bx and By) will hereinafter be described with reference to FIGS. 1 through 5 and further reference to FIGS. 6 through 27.

Figure 6:
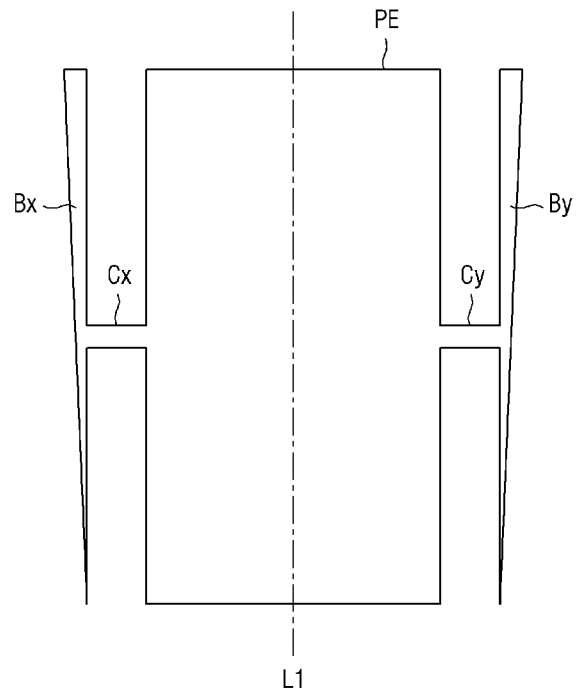
FIGS. 6 through 27 are schematic plan views of various modifications of the bar-type conductors of the LCD device according to the exemplary embodiment of FIG. 1.
Figure 7:
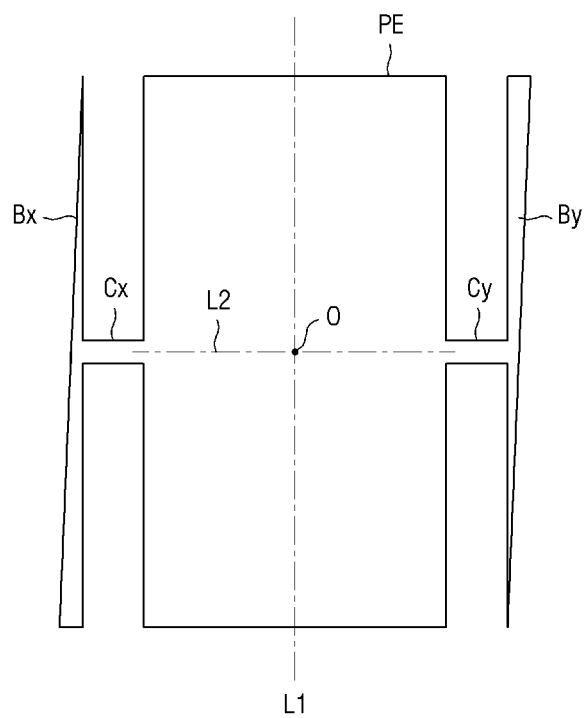

FIGS. 6 and 7 illustrate examples in which the conductive bars (Bx and By) are in the shape of right triangles. More specifically, referring to FIG. 6, the first and second conductive bars Bx and By may be symmetrical with respect to an imaginary vertical line L1 that passes through the pixel electrode PE, i.e., may be in line symmetry with each other.

In an alternative exemplary embodiment, referring to FIG. 7, the first and second conductive bars Bx and By may be symmetrical with respect to an intersection O between an imaginary vertical line L1 and an imaginary horizontal line L2 that both pass through the pixel electrode PE, i.e., may be in point symmetry with each other.

Figure 8:
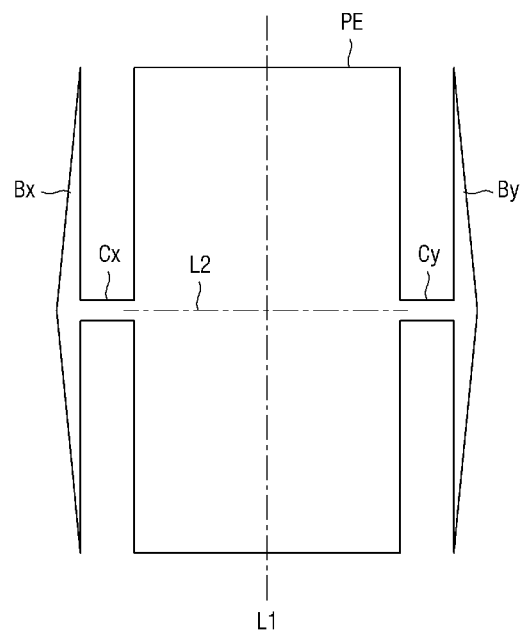
Figure 9:
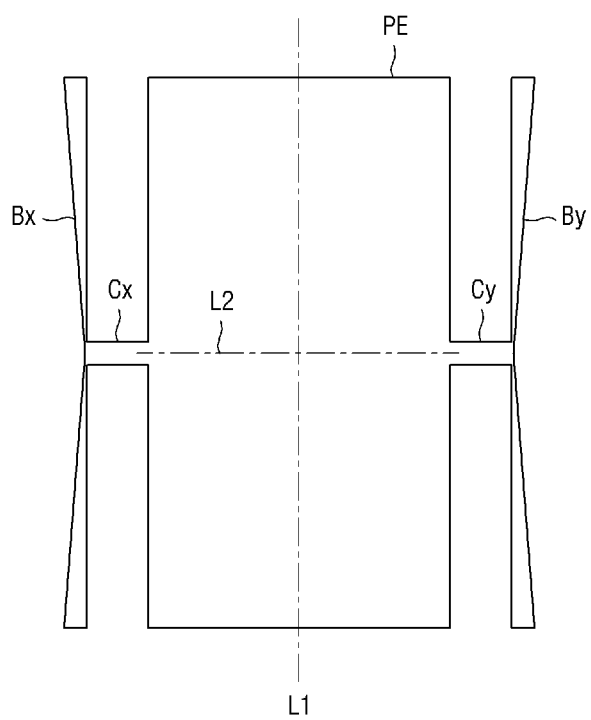

FIGS. 8 and 9 illustrate examples in which each of the conductive bars (Bx and By) consists of two identical right triangles that are symmetrical with respect to a horizontal line L2. Referring to FIG. 8, each of the first and second conductive bars Bx and By may have a shape provided by combining two identical right triangles in such a manner that apexes of the two identical right triangles that form a right angle meet. In an alternative exemplary embodiment, referring to FIG. 9, each of the first and second conductive bars Bx and By may have a shape provided by combining two identical right triangles in such a manner that apexes of the two identical right triangles that form an acute angle meet. In an alternative exemplary embodiment, although not illustrated, the first conductive bar Bx may have one of the two shapes illustrated in FIGS. 8 and 9, and the second conductive bar By may have the other shape.

Figure 10:
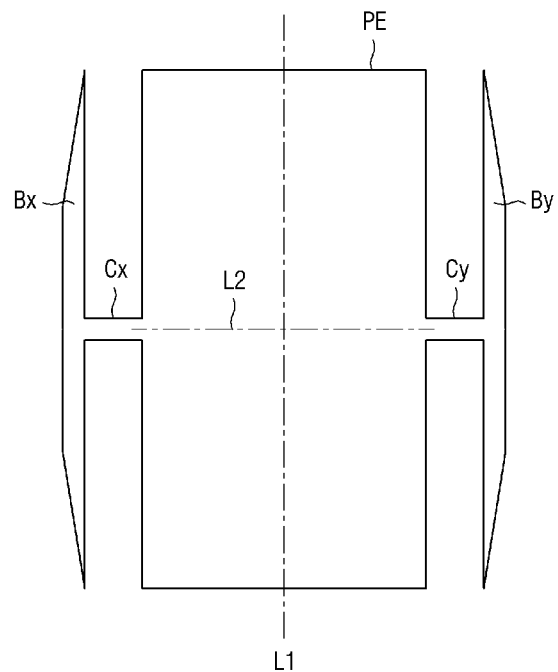
Figure 11:
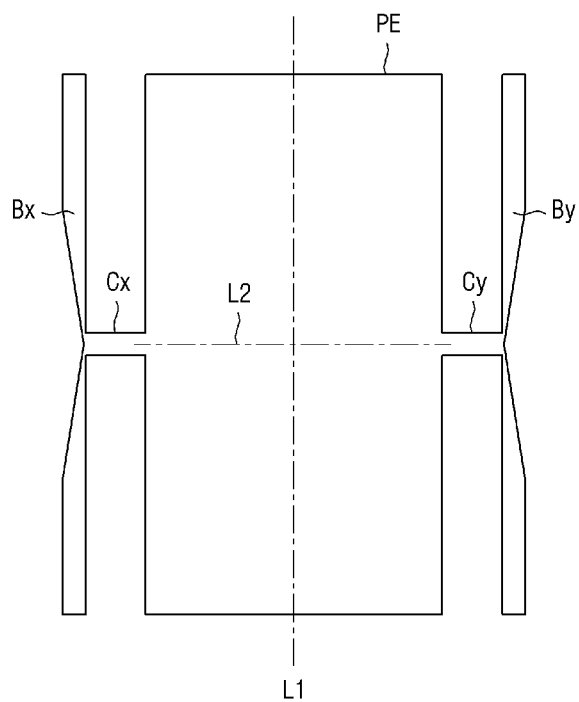

FIGS. 10 and 11 illustrate examples in which each of the conductive bars (Bx and By) consists of two identical trapezoids that are symmetrical with respect to a horizontal line L2. Referring to FIGS. 10 and 11, each of the first and second conductive bars Bx and By may have an apex that forms a right angle and an apex that forms an acute angle. More specifically, as illustrated in FIG. 10, each of the first and second conductive bars Bx and By may have a shape provided by combining two identical trapezoids in such a manner that apexes of the two identical trapezoids that form a right angle meet. In an alternative exemplary embodiment, as illustrated in FIG. 11, each of the first and second conductive bars Bx and By may have a shape provided by combining two identical trapezoids in such a manner that apexes of the two identical trapezoids that form an acute angle meet. In an alternative exemplary embodiment, although not illustrated, the first conductive bar Bx may have one of the two shapes illustrated in FIGS. 10 and 11, and the second conductive bar By may have the other shape.

Figure 12:
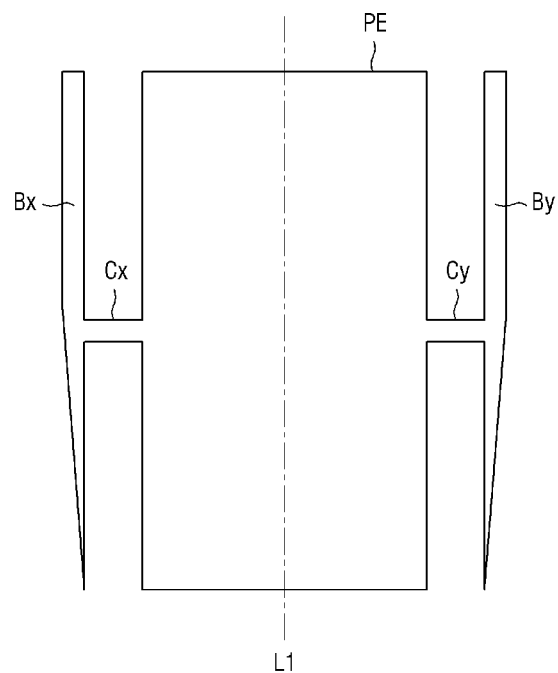
Figure 13:
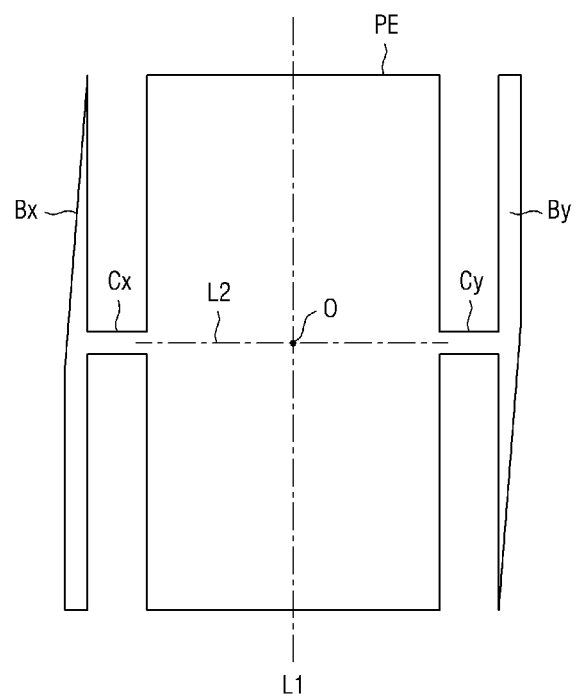

FIGS. 12 and 13 illustrate examples in which the conductive bars (Bx and By) are in the shape of trapezoids. Referring to FIG. 12, each of the first and second conductive bars Bx and By may be symmetrical with respect to an imaginary vertical line L1, i.e., may be in line symmetry with each other. In an alternative exemplary embodiment, referring to FIG. 13, each of the first and second conductive bars Bx and By may be symmetrical with respect to an intersection O between an imaginary vertical line L1 and an imaginary horizontal line L2 that both pass through the pixel electrode PE, i.e., may be in point symmetry with each other.

Figure 14:
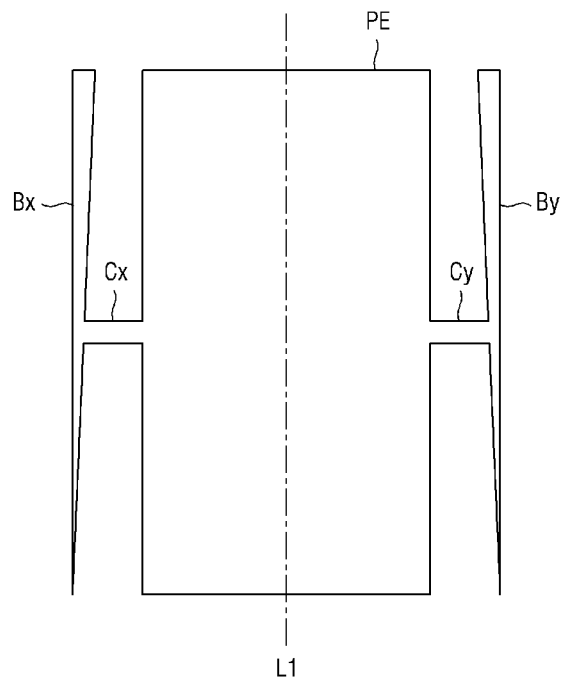
Figure 15:
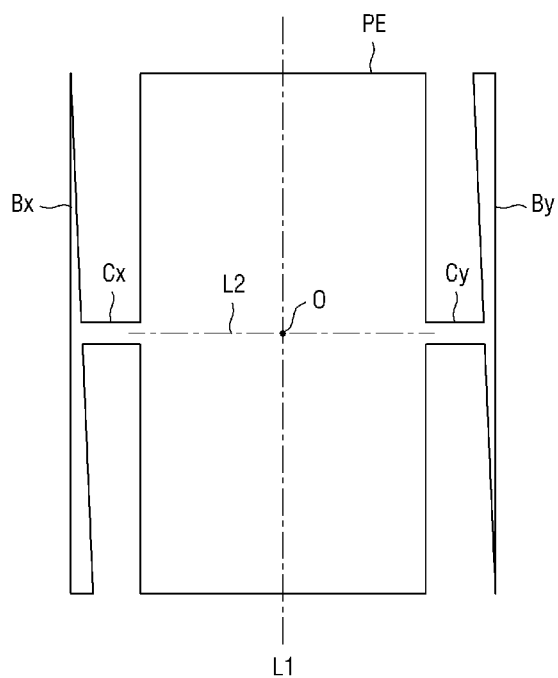
Figure 16:
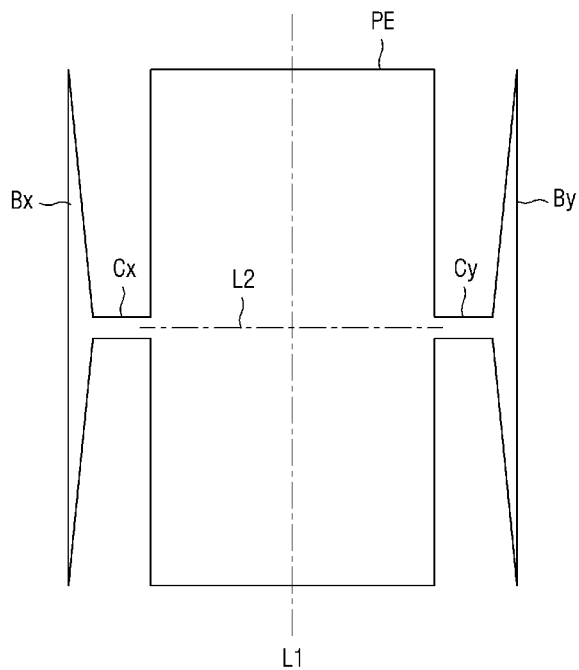
Figure 17:
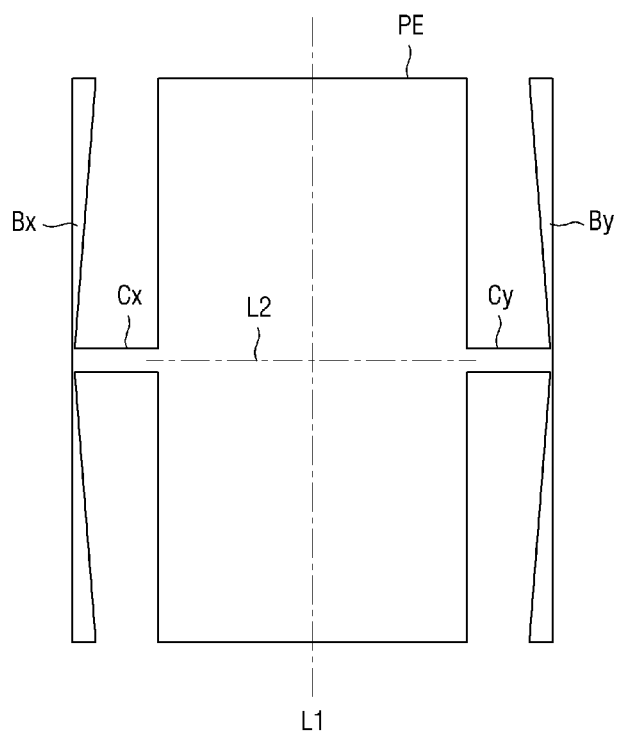
Figure 18:
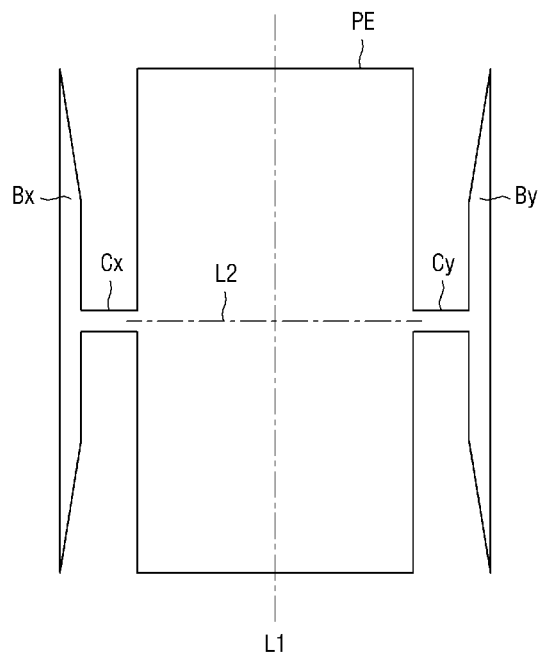
Figure 19:
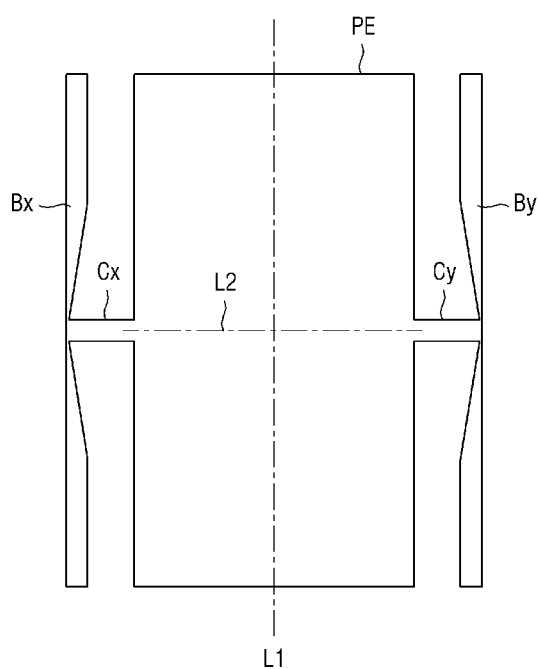
Figure 20:
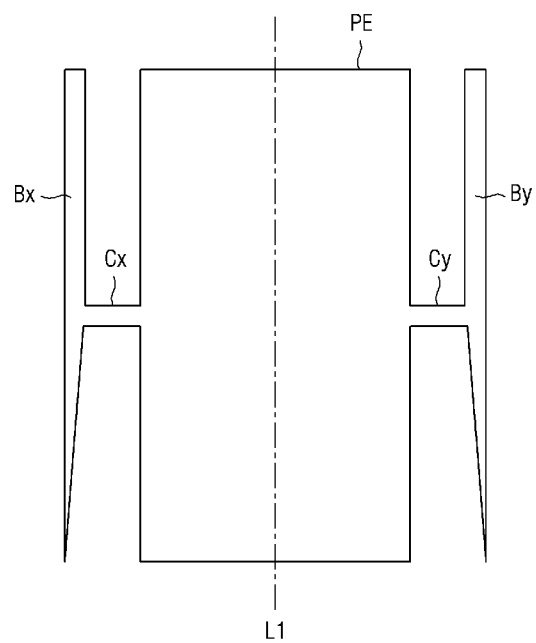
Figure 21:
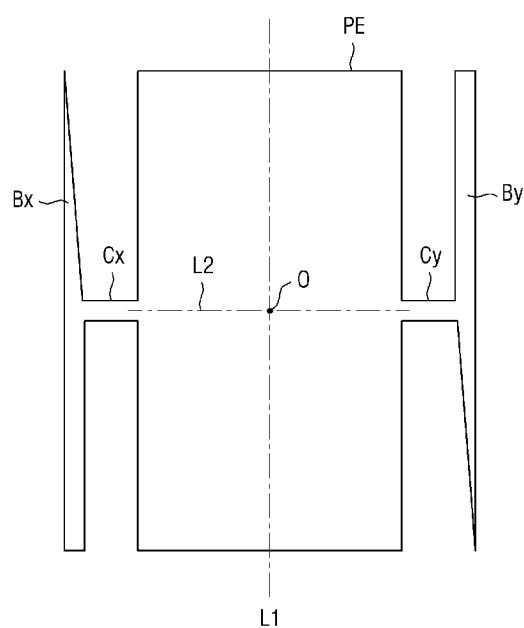

FIGS. 14 and 15 illustrate examples in which the conductive bars (Bx and By) are in the shape of right triangles, FIGS. 16 and 17 illustrate examples in which each of the conductive bars (Bx and By) consists of two identical right angles that are symmetrical with respect to a horizontal line L2, FIGS. 18 and 19 illustrate examples in which each of the conductive bars (Bx and By) consists of two identical trapezoids that are symmetrical with respect to a horizontal line L2, and FIGS. 20 and 21 illustrate examples in which the conductive bars (Bx and By) are in the shape of trapezoids. The exemplary embodiments of FIGS. 14 through 21 are substantially the same as the exemplary embodiments of FIGS. 6 through 13 except that the outer edges (BE2x and BE2y) of the conductive bars (Bx and By) are parallel to the edges of the pixel electrode PE.

That is, each of the conductive bars (Bx and By) may have a portion whose width changes along the lengthwise direction of the conductive bars (Bx and By) (or along the vertical direction), and the shape of the corresponding portion may vary.

Figure 22:
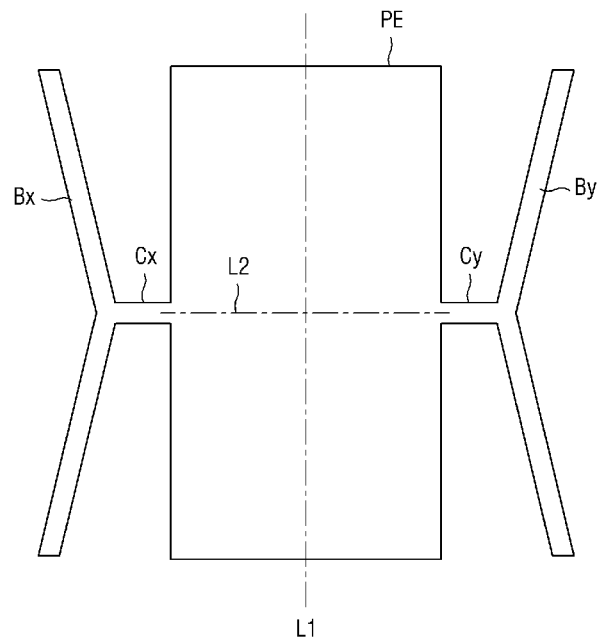
Figure 23:
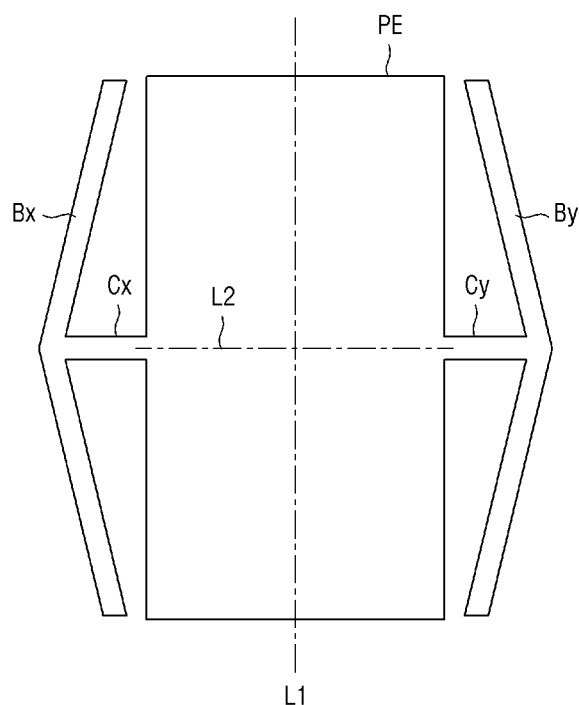

FIGS. 22 and 23 illustrate examples in which the inner edges (BE1x and BE1y, refer to FIG. 5) and the outer edges (BE2x and BE2y, refer to FIG. 5) of the conductive bars (Bx and By) are both not parallel to the edges of the pixel electrode PE. Referring to FIG. 22, each of the first and second conductive bars Bx and By may be bent outwardly with respect to the pixel electrode PE, i.e., toward directions that the outer edges (BE2x and BE2y) of the conductive bars (Bx and By) respectively face. In an alternative exemplary embodiment, referring to FIG. 23, each of the first and second conductive bars Bx and By may be bent inwardly with respect to the pixel electrode PE, i.e., toward directions that the inner edges (BE1x and BE1y) of the conductive bars (Bx and By) respectively face. In an alternative exemplary embodiment, although not illustrated, the first conductive bar Bx may have one of the two shapes illustrated in FIGS. 22 and 23, and the second conductive bar By may have the other shape.

FIGS. 24 through 27 illustrate examples in which the inner edges (BE1x and BE1y, refer to FIG. 5) or the outer edges (BE2x and BE2y, refer to FIG. 5) of the conductive bars (Bx and By) are partially parallel to the edges of the pixel electrode PE.

Figure 24:
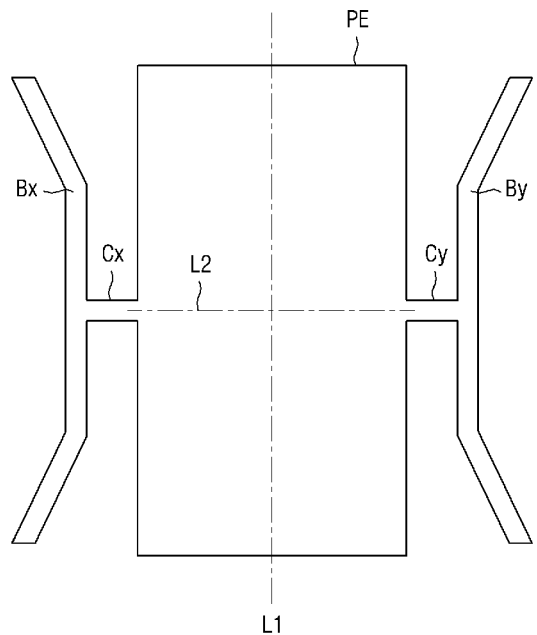
Figure 25:
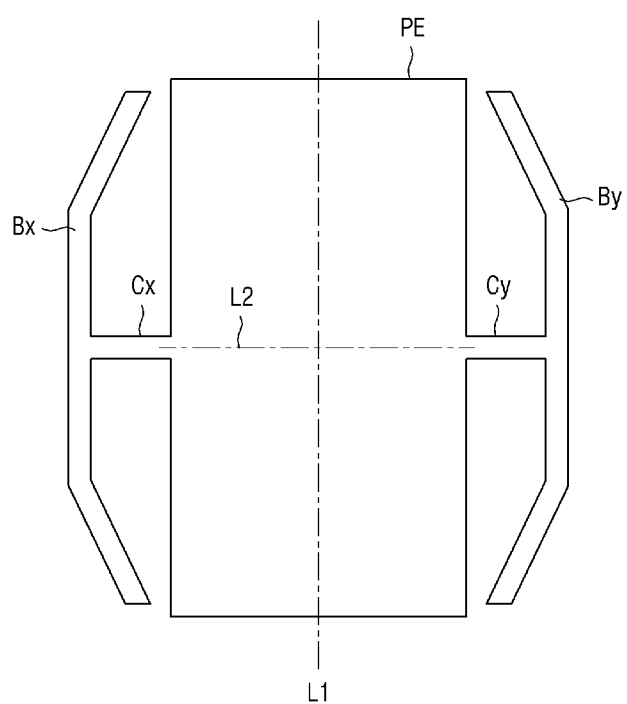

Referring to FIGS. 24 and 25, portions (hereinafter, bar connecting portions) of the first and second conductive bars Bx and By that are connected to the connectors (Cx and Cy) may be parallel to the edges of the pixel electrode PE. The entire first and second conductive bars Bx and By except for the bar connecting portions may be bent outwardly with respect to the pixel electrode PE, i.e., toward directions that the outer edges (BE2x and BE2y) of the conductive bars (Bx and By) respectively face, as illustrated in FIG. 24. In an alternative exemplary embodiment, the entire first and second conductive bars Bx and By except for the bar connecting portions may be bent toward the pixel electrode PE, as illustrated in FIG. 25.

Figure 26:
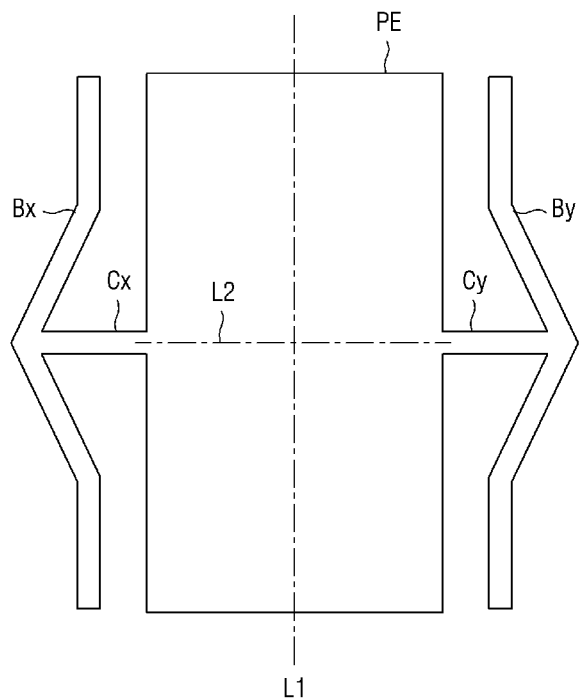
Figure 27:
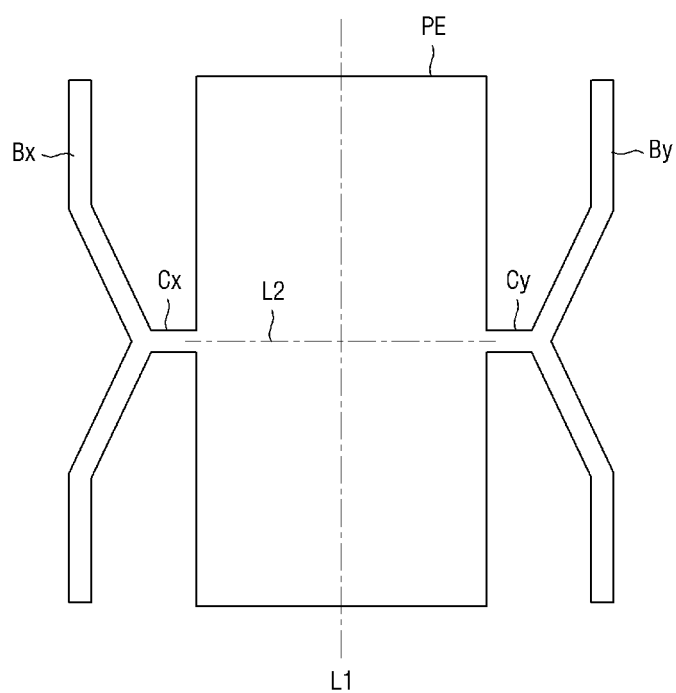

In an alternative exemplary embodiment, as illustrated in FIG. 26, the bar connecting portions of the first and second conductive bars Bx and By may be bent outwardly with respect to the pixel electrode PE, and the rest of the first and second conductive bars Bx and By may be parallel to the edges of the pixel electrode PE. In an alternative exemplary embodiment, as illustrated in FIG. 27, the bar connecting portions of the first and second conductive bars Bx and By may be bent inwardly with respect to the pixel electrode PE, and the rest of the first and second conductive bars Bx and By may be parallel to the edges of the pixel electrode PE.

However, the invention is not limited thereto, and the shape of the conductive bars (Bx and By) may vary.

Referring again to FIGS. 1 through 5, the connectors (Cx and Cy) electrically connect the pixel electrode PE and the conductive bars (Bx and By). The connectors (Cx and Cy) include a first connector Cx, which connects the first conductive bar Bx and the pixel electrode PE, and a second connector Cy, which connects the second conductive bar By and the pixel electrode PE. However, the invention is not limited thereto, and the number and positions of the connectors (Cx and Cy) may vary.

In an exemplary embodiment, the conductive bars (Bx and By) and the connectors (Cx and Cy) may include a transparent conductive material such as, for example, ITO, IZO, ITZO, or AZO, or a reflective metal such as Al, Ag, Cr, or an alloy thereof. The conductive bars (Bx and By) and the connectors (Cx and Cy) may include the same material as that of the pixel electrode PE. In exemplary embodiments, the conductive bars (Bx and By), the connectors (Cx and Cy), and the pixel electrode PE may be provided at the same time by the same process using a single mask.

Shielding electrodes (SHE1 and SHE2) may be disposed on the second passivation layer PA2. The shielding electrodes (SHE1 and SHE2) may be physically isolated and electrically insulated from the conductive bars (Bx and By) and the pixel electrode PE. The shielding electrodes (SHE1 and SHE2) may be disposed on the same layer as that on which the conductive bars (Bx and By) and the pixel electrode PE is disposed. That is, the shielding electrodes (SHE1 and SHE2), like the conductive bars (Bx and By) and the pixel electrode PE, may be disposed directly on the second passivation layer PA2 and may thus directly contact the second passivation layer PA2. The shielding electrodes (SHE1 and SHE2) may include a transparent conductive material and may include the same material as that of the conductive bars (Bx and By) and the pixel electrode PE. In exemplary embodiments, the shielding electrodes (SHE1 and SHE2), the conductive bars (Bx and By), and the pixel electrode PE may be provided at the same time by the same process using a single mask.

The shielding electrodes (SHE1 and SHE2) may be disposed on parts of the second passivation layer PA2 corresponding to the data lines (DLm and DLm+1) and may overlap the data lines (DLm and DLm+1). That is, the shielding electrodes (SHE1 and SHE2) may be disposed above the data lines (DLm and DLm+1), may be insulated from the data lines (DLm and DLm+1), and may extend in a direction (e.g., the vertical direction) in which the data lines (DLm and DLm+1) extend, overlapping the data lines (DLm and DLm+1). For convenience, a shielding electrode SHE1 overlapping the first data line DLm will hereinafter be referred to as a first shielding electrode SHE1, and a shielding electrode SHE2 overlapping the second data line DLm+1 will hereinafter be referred to as a second shielding electrode SHE2.

As seen in a plan view, the width of the first shielding electrode SHE1 in the horizontal direction, i.e., in the direction in which the gate line GLn extends, may be larger than the width of the first data line DLm in the horizontal direction. Similarly, as seen in a plan view, the width of the second shielding electrode SHE2 in the horizontal direction, i.e., in the direction in which the gate line GLn extends, may be larger than the width of the second data line DLm+1 in the horizontal direction. As seen in a plan view, the first shielding electrode SHE1 may cover the first data line DLm, and the second shielding electrode SHE2 may cover the second data line DLm+1.

In exemplary embodiments, a voltage having the same level as that of a common voltage, which is applied to a common electrode CE that will be described later, may be applied to the shielding electrodes (SHE1 and SHE2). In an alternative exemplary embodiment, in other exemplary embodiments, a voltage having the same level as that of a sustain voltage, which is applied to a sustain electrode line SLn, may be applied to the shielding electrodes (SHE1 and SHE2).

The sustain electrode line SLn may be further disposed on the first base unit SUB1. The sustain electrode line SLn may extend substantially in the same direction (e.g., the horizontal direction) as the gate line GLn. The sustain electrode line SLn may include first and second sustain electrodes SLna and SLnb, which are disposed near the edges of the pixel electrode PE. The first and second sustain electrodes SLna and SLnb may block or reduce a coupling field between the pixel electrode PE and the data lines (DLm and DLm+1).

The sustain electrode line SLn may at least partially overlap the conductive bars (Bx and By). In exemplary embodiments, the first sustain electrode SLna of the sustain electrode line SLn may overlap the first conductive bar Bx. As seen in a plan view, the first sustain electrode SLna may be disposed between the first shielding electrode SHE1 and the first conductive bar Bx and may cover a gap G between the first shielding electrode SHE1 and the first conductive bar Bx by overlapping the first conductive bar Bx. The first sustain electrode SLna, which overlaps the first conductive bar Bx, may partially overlap the first shielding electrode SHE1. The first sustain electrode SLna may not overlap the pixel electrode PE, and particularly, the first edge E1 of the pixel electrode PE.

Similarly, the second sustain electrode SLnb may overlap the second conductive bar By, may partially overlap the second shielding electrode SHE2, but may not overlap the pixel electrode PE.

In exemplary embodiments, the sustain electrode line SLn may be disposed on the same layer as that on which the gate line GLn and the gate electrode GE are disposed, and may include the same material as that of the gate line GLn and the gate electrode GE. That is, the sustain electrode line SLn may be disposed between the first base unit SUB1 and the gate insulating layer GI and may include the same material as that of the gate line GLn. In other exemplary embodiments, the sustain electrode line SLn may be disposed on the same layer as that on which the data lines (DLm and DLm+1) is disposed, and may include the same material as that of the data lines (DLm and DLm+1). That is, the sustain electrode line SLn, like the data lines (DLm and DLm+1), may be disposed between the gate insulating layer GI and the first passivation layer PA1 and may include the same material as that of the data lines (DLm and DLm+1). For convenience, it is assumed that the sustain electrode line SLn is disposed on the same layer as that on which the gate line GLn is disposed.

The counter substrate 200 will hereinafter be described.

The counter substrate 200 may include a second base unit SUB2, a light-shielding member BM, a color filter CF, an overcoat layer OC, and the common electrode CE.

The second base unit SUB2, like the first base unit SUB1, may include a transparent insulating substrate. In an exemplary embodiment, the second base unit SUB2 may comprise a polymer or a plastic material having high thermal resistance. In exemplary embodiments, the second base unit SUB2 may have flexibility.

The light-shielding member BM may be disposed between the second base unit SUB2 and the liquid crystal layer 300, and particularly, on a surface of the second base unit SUB2 that faces the first base unit SUB1. In exemplary embodiments, the light-shielding member BM may have portions overlapping the gate line GLn and the TFT Tr and portions BM1 overlapping the data lines (DLm and DLm+1). In an exemplary embodiment, the light-shielding member BM may comprise a light-shielding pigment such as black carbon or an opaque material such as Cr, and may further comprise a photosensitive organic material. In another exemplary embodiment, the portions BM1 of the light-shielding member BM, which overlap the data lines (DLm and DLm+1), may not be provided.

In an exemplary embodiment, the color filter CF may display one of the primary colors such as red, green, and blue, but the invention is not limited thereto. That is, in another exemplary embodiment, the color filter CF may display one of cyan, magenta, yellow, and white, for example. In exemplary embodiments, in a case in which the organic layer ILA comprises a color pigment, the color filter CF may not be provided.

The overcoat layer OC may be disposed on the second base unit SUB2, the light-shielding member BM, and the color filter CF and may cover the light-shielding member BM. The overcoat layer OC may planarize height differences provided by the light-shielding member BM and the color filter CF. In other exemplary embodiments, the overcoat layer OC may not be provided as necessary.

The common electrode CE may be disposed on the overcoat layer OC. In an exemplary embodiment, the common electrode CE may include a transparent conductive material such as ITO or IZO. In exemplary embodiments, the common electrode CE may be disposed on the entire surface of the second base unit SUB2. The common electrode CE may be disposed as a planar shape. The common electrode CE may be provided as a single plate to face the pixel electrode PE. The common voltage may be applied to the common electrode CE, and thus, the common electrode CE may generate an electric field with the pixel electrode PE. The pixel electrode PE may receive a data voltage via the TFT Tr, and the common electrode CE may receive the common voltage, which has a different level from the data voltage. Accordingly, an electric field corresponding to the difference between the common voltage and the data voltage may be generated. The alignment of the liquid crystal molecules 310 in the liquid crystal layer 300 may change according to the intensity of the electric field, and as a result, the light transmittance of the LCD device 1 may be controlled.

Although not illustrated, alignment layers may be disposed on the inside of the array substrate 100 and the counter substrate 200, respectively. In an exemplary embodiment, the alignment layers may be vertical alignment layers.

The liquid crystal layer 300 may be disposed between the array substrate 100 and the counter substrate 200 and may include the liquid crystal molecules 310, which have negative dielectric anisotropy. The liquid crystal molecules 310 may have a pretilt so as for their long axes to be substantially parallel to a lengthwise direction of the branches PEb of the pixel electrode PE, i.e., the direction in which the branches PEb of the pixel electrode PE extend. The liquid crystal molecules 310 may be vertically aligned with respect to the surfaces of the array substrate 100 and the counter substrate 200 in the absence of an electric field. The liquid crystal layer 300 may further include an aligning agent comprising a reactive mesogen, and due to the aligning agent, the liquid crystal molecules 310 may have a pretilt so as for their long axes to be substantially parallel to the lengthwise direction of the branches PEb of the pixel electrode PE, i.e., the direction in which the branches PEb of the pixel electrode PE extend.

In an alternative exemplary embodiment, the aligning agent may be included in the alignment layers. In this case, the alignment layers may have main chains and side chains, and the aligning agent may provide the side chains such that the liquid crystal molecules 310 may have negative dielectric anisotropy. Due to the side chains, the liquid crystal molecules 310 may have a pretilt so as for their long axes to be substantially parallel to the lengthwise direction of the branches PEb of the pixel electrode PE, i.e., the direction in which the branches PEb of the pixel electrode PE extend.

The operation of the LCD device 1 will hereinafter be described.

In response to a gate signal being applied to the gate line GLn, the TFT Tr, which is the switching device connected to the gate line GLn, is turned on, and a data voltage applied to the first data line DLm is applied to the pixel electrode PE via the TFT Tr. Then, the pixel electrode PE generates an electric field with the common electrode CE, which receives the common voltage. The liquid crystal molecules 310 of the liquid crystal layer 300 may respond to the electric field and may be aligned so as for their long axes to be perpendicular to the direction of the electric field.

The pixel electrode PE and the common electrode CE may generate a vertical field in the liquid crystal layer 300, and a fringe field may be generated among the branches PEb. Due to the fringe field, the liquid crystal molecules 310 are aligned in a particular direction and are eventually tilted in a direction substantially parallel to the lengthwise direction of the branches PEb.

Referring to FIGS. 1 through 5, horizontal components EF1 of a fringe field generated between the common electrode CE and the branches PEb are oriented substantially toward a direction perpendicular to the edges of the branches PEb in edge areas of the pixel electrode PE where the ends of the branches PEb are not connected together. Horizontal components EF2 of a fringe field generated between the first inner edge BE1x of the first conductive bar Bx and the common electrode CE are oriented substantially toward a direction perpendicular to the lengthwise direction of the first conductive bar Bx, which is almost the opposite of the direction of the horizontal components EF1 of the fringe field generated by the branches PEb. The horizontal components EF1 of the fringe field generated by the edges of the branches PEb and the horizontal components EF2 of the fringe field generated by the first inner edge BE1x of the first conductive bar Bx may offset each other. Also, the conductive bars (Bx and By) may block an external electric field. Accordingly, the liquid crystal molecules 310 may be prevented from being misaligned from being substantially parallel to the lengthwise direction of the branches PEb. Therefore, the transmittance of the LCD device 1 may be enhanced along the edges of the pixel electrode PE.

A voltage of the same level as that of the common voltage may be applied to the shielding electrodes (SHE1 and SHE2). Thus, no electric field is generated, or only a weak electric field is generated, between the common electrode CE and the shielding electrodes (SHE1 and SHE2). Accordingly, the likelihood of the liquid crystal molecules 310 being misaligned in areas adjacent to the data lines (DLm and DLm+1). As a result, light leakage that may be caused by misaligned liquid crystal molecules in the areas adjacent to the data lines (DLm and DLm+1) may be reduced, the area of the light-shielding member BM may also be reduced, and the aperture ratio of the LCD device 1 may be improved.

FIGS. 28 through 40 are schematic plan views of various modifications of the pixel electrode and the bar-type conductors of the LCD device according to the exemplary embodiment of FIG. 1.

Figure 28:
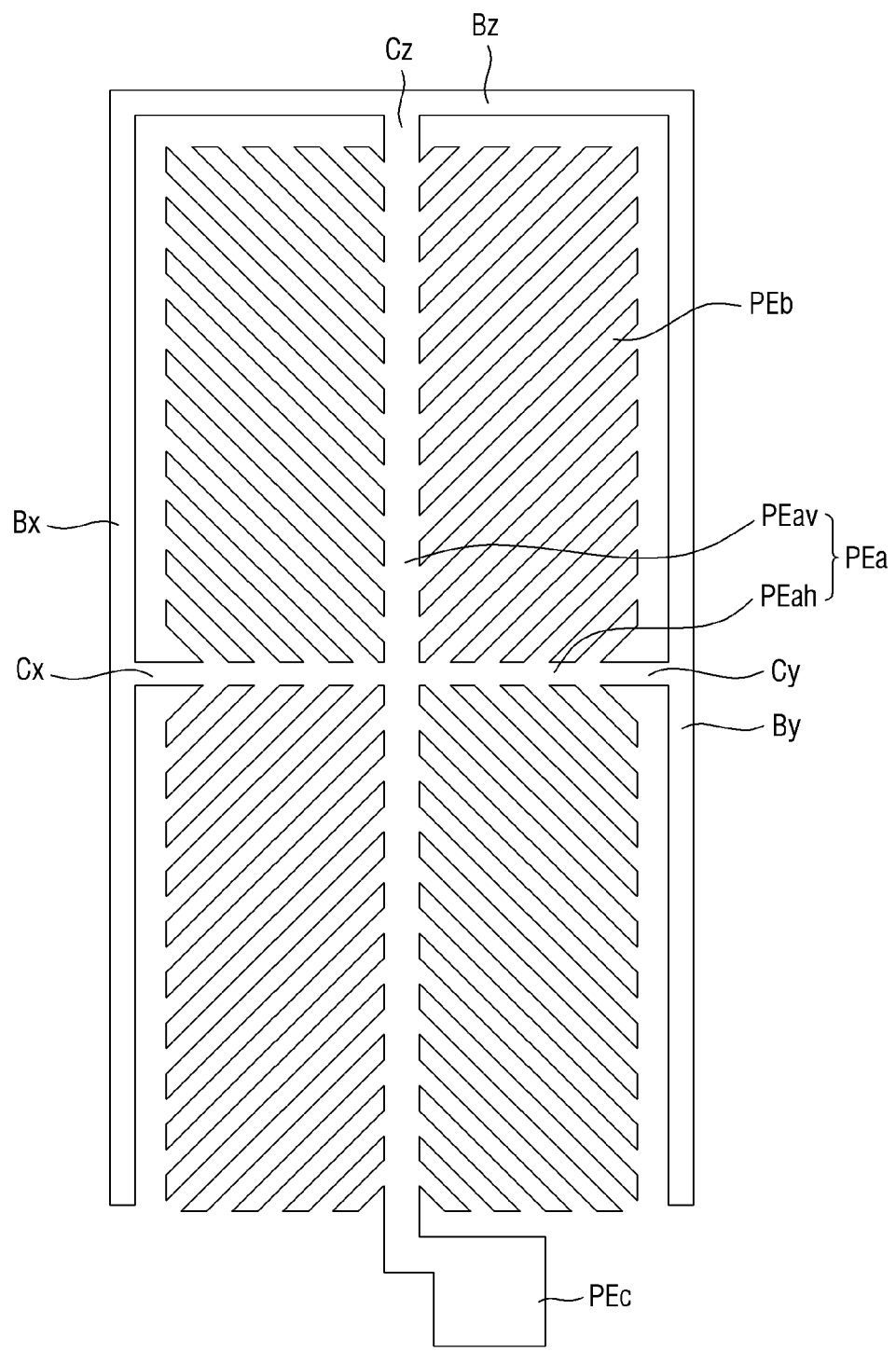
FIGS. 28 through 40 are schematic plan views of various modifications of the pixel electrode and the bar-type conductors of the exemplary embodiment of the LCD device of FIG. 1.

Referring to FIGS. 1, 5, and 28, the exemplary embodiment of FIG. 28 is substantially the same as the exemplary embodiment of FIG. 5 except that a pixel electrode PE has no particular branch connector at a third edge E3 thereof and includes a third conductive bar Bz, which faces the third edge E3 of the pixel electrode PE, and a third connector Cz, which connects the pixel electrode PE and the third conductive bar Bz.

The third conductive bar Bz may be connected to a first conductive bar Bx or a second conductive bar By. In an alternative exemplary embodiment, as illustrated in FIG. 28, the third conductive bar Bz may be connected to both the first and second conductive bars Bx and By, in which case, at least one of a first connector Cx, a second connector Cy, and the third connector Cz may not be provided.

Figure 29:
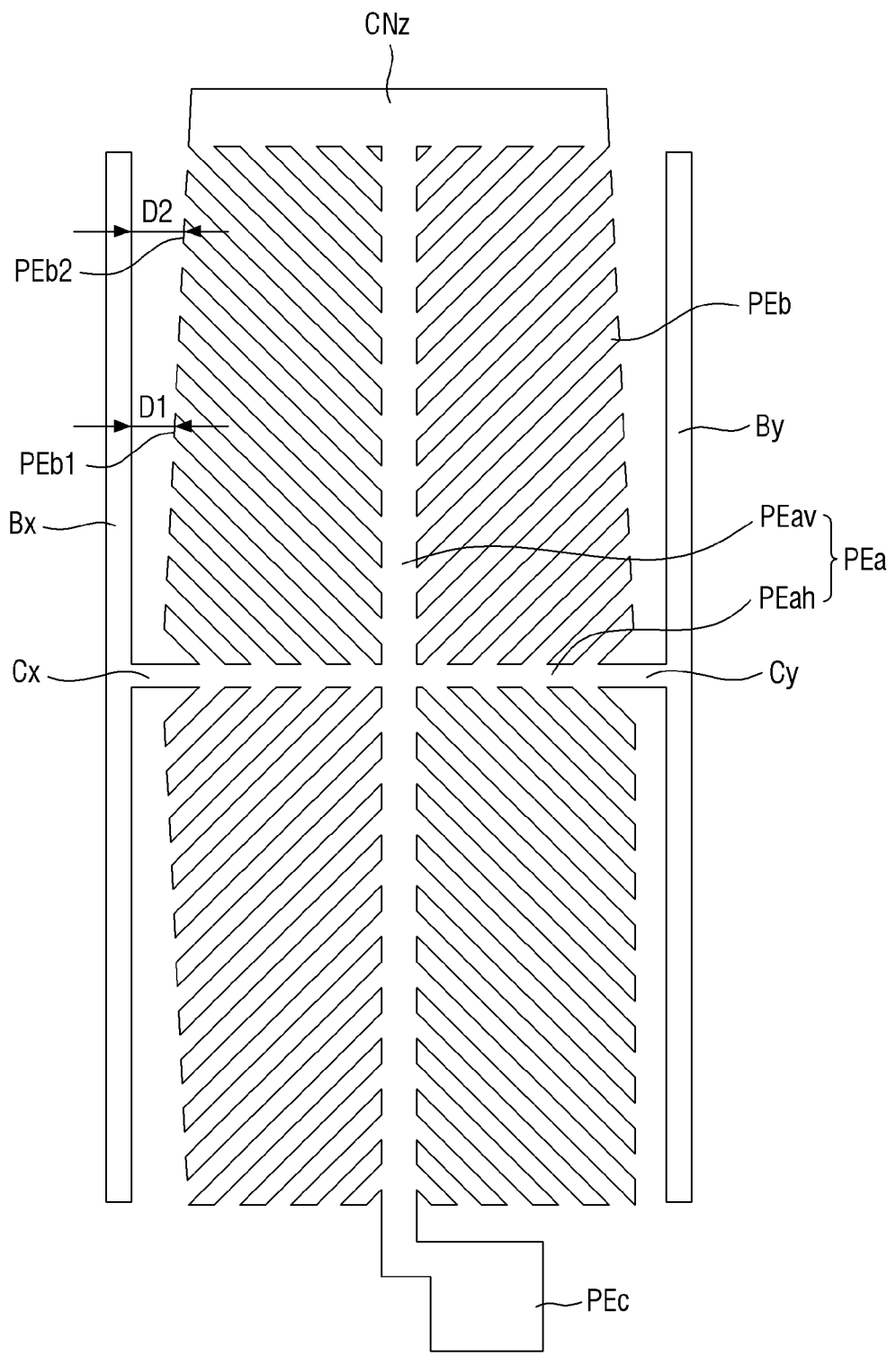

Referring to FIGS. 1, 5, and 29, the exemplary embodiment of FIG. 29 differs from the exemplary embodiment of FIG. 5 in that the distances between conductive bars (Bx and By) and the edges of a pixel electrode PE vary. More specifically, between two arbitrary branches facing the first conductive bar Bx, when one branch relatively adjacent to a horizontal stem PEah is defined as a first branch PEb1 and the other branch relatively apart from the horizontal stem PEah is defined as a second branch PEb2, a minimum distance D1 between the end of the first branch PEb1 and the first conductive bar Bx may be smaller than a minimum distance D2 between the end of the second branch PEb2 and the first conductive bar Bx.

That is, in the exemplary embodiment of FIG. 29, the distances between the edges of the pixel electrode PE and the conductive bars (Bx and By) may be changed along a lengthwise direction of the conductive bars (Bx and By) or a vertical direction by changing the planar shape of the pixel electrode PE. As a result, texture that may be generated in the LCD device 1 can be controlled.

Figure 30:
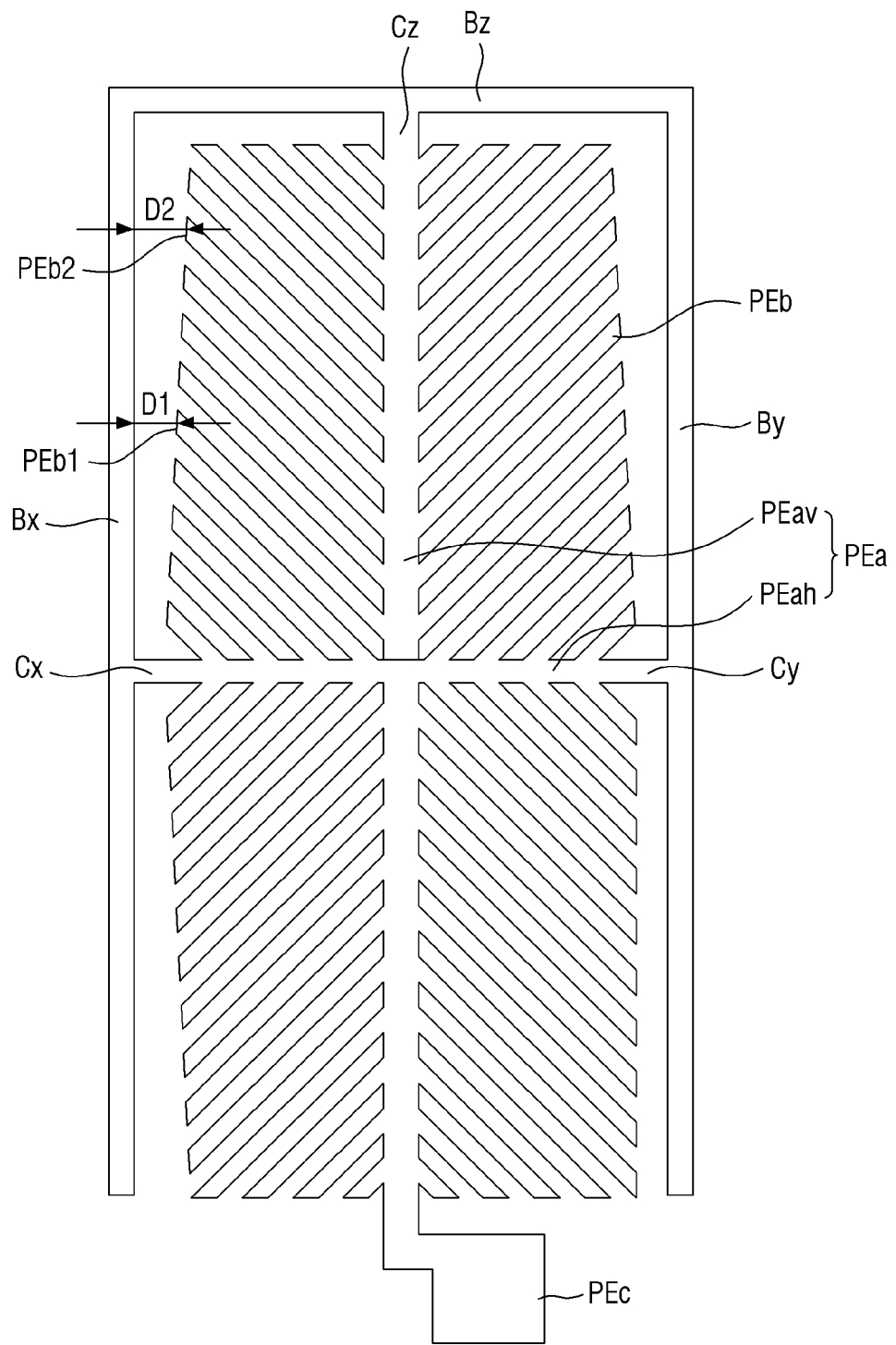

Referring to FIGS. 1, 5, 29, and 30, the exemplary embodiment of FIG. 30 is substantially the same as the exemplary embodiment of FIG. 29 except that a pixel electrode PE has no particular branch connector at a third edge E3 thereof and includes a third conductive bar Bz, which faces the third edge E3 of the pixel electrode PE, and a third connector Cz, which connects the pixel electrode PE and the third conductive bar Bz.

Figure 31:
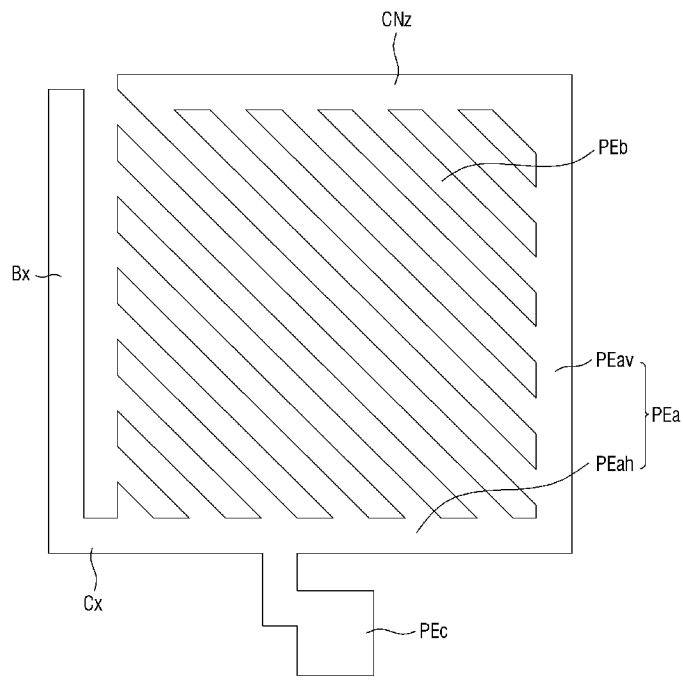

Referring to FIGS. 1, 5, and 31, the exemplary embodiment of FIG. 31 differs from the exemplary embodiment of FIG. 5 in that a pixel electrode PE is divided into a single sub-region. More specifically, the end of a vertical stem PEav and the end of a horizontal stem PEah may be connected to each other, and thus, a stem PEa may have an L shape, an L shape rotated 90 degrees counterclockwise, an L shape rotated 90 degrees clockwise, or an L shape rotated 180 degrees, for example. Accordingly, the pixel electrode PE may be divided into a single sub-region. FIG. 31 illustrates an example in which the stem PEa is in the form of an L shape rotated 90 degrees counterclockwise.

Branches PEb may extend from the stem PEa in an upper left direction. As mentioned above, the ends of some of the branches PEb may not be connected to one another.

A first conductive bar Bx, which faces the pixel electrode PE, may be disposed on a left edge (or the first edge E1 of FIG. 5) of the pixel electrode PE and may be connected to the pixel electrode PE via a first connector Cx. A branch connector CNz, which connects the ends of the branches PEb, may be disposed on an upper edge (or the third edge E3 of FIG. 5) of the pixel electrode PE.

Although not illustrated, a second conductive bar, which faces the pixel electrode PE, and a second connector, which connects the second conductive bar and the pixel electrode PE, may be further disposed on a right edge (or the second edge E2 of FIG. 5) of the pixel electrode PE.

Figure 32:
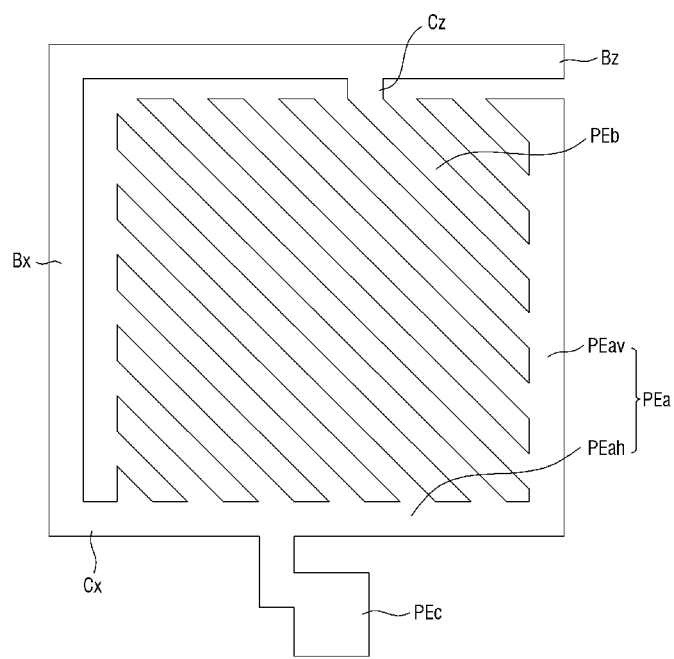

Referring to FIGS. 1, 5, 31, and 32, the exemplary embodiment of FIG. 32 is substantially the same as the exemplary embodiment of FIG. 31 except that a pixel electrode PE has no particular branch connector at an upper edge (or the third edge E3 of FIG. 5) thereof and includes a third conductive bar Bz, which faces the upper edge (or the third edge E3 of FIG. 5) of the pixel electrode PE, and a third connector Cz, which connects the pixel electrode PE and the third conductive bar Bz.

Figure 33:
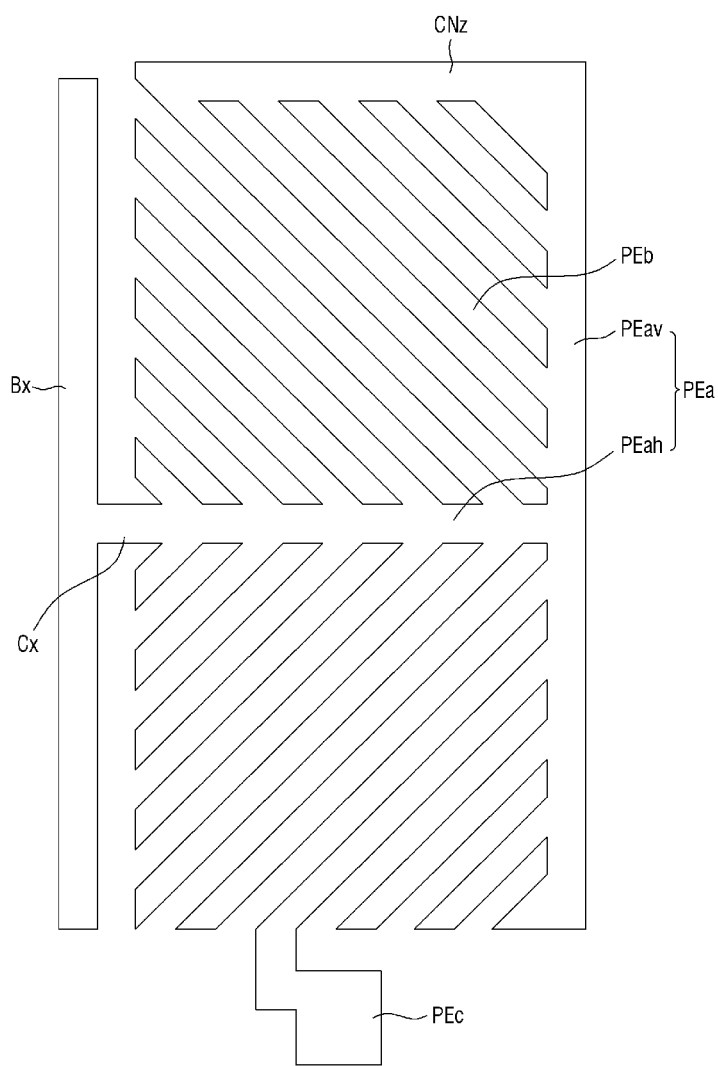

Referring to FIGS. 1, 5, and 33, the exemplary embodiment of FIG. 33 differs from the exemplary embodiment of FIG. 5 in that a pixel electrode PE is divided into two sub-regions. More specifically, the end of a vertical stem PEav and the end of a horizontal stem PEah may be connected to each other, and thus, a stem PEa may have a T shape rotated 90 degrees counterclockwise or a T shape rotated 90 degrees clockwise. Accordingly, the pixel electrode PE may be divided into two sub-regions. FIG. 33 illustrates an example in which the stem PEa is in the form of a T shape rotated 90 degrees clockwise.

Branches PEb may extend from the stem PEa in an upper left direction or in a lower left direction. As mentioned above, the ends of some of the branches PEb may not be connected to one another.

A first conductive bar Bx, which faces the pixel electrode PE, may be disposed on a left edge (or the first edge E1 of FIG. 5) of the pixel electrode PE and may be connected to the pixel electrode PE via a first connector Cx. A branch connector CNz, which connects the ends of the branches PEb, may be disposed on an upper edge (or the third edge E3 of FIG. 5) of the pixel electrode PE.

Although not illustrated, a second conductive bar, which faces the pixel electrode PE, and a second connector, which connects the second conductive bar and the pixel electrode PE, may be further disposed on a right edge (or the second edge E2 of FIG. 5) of the pixel electrode PE.

Figure 34:
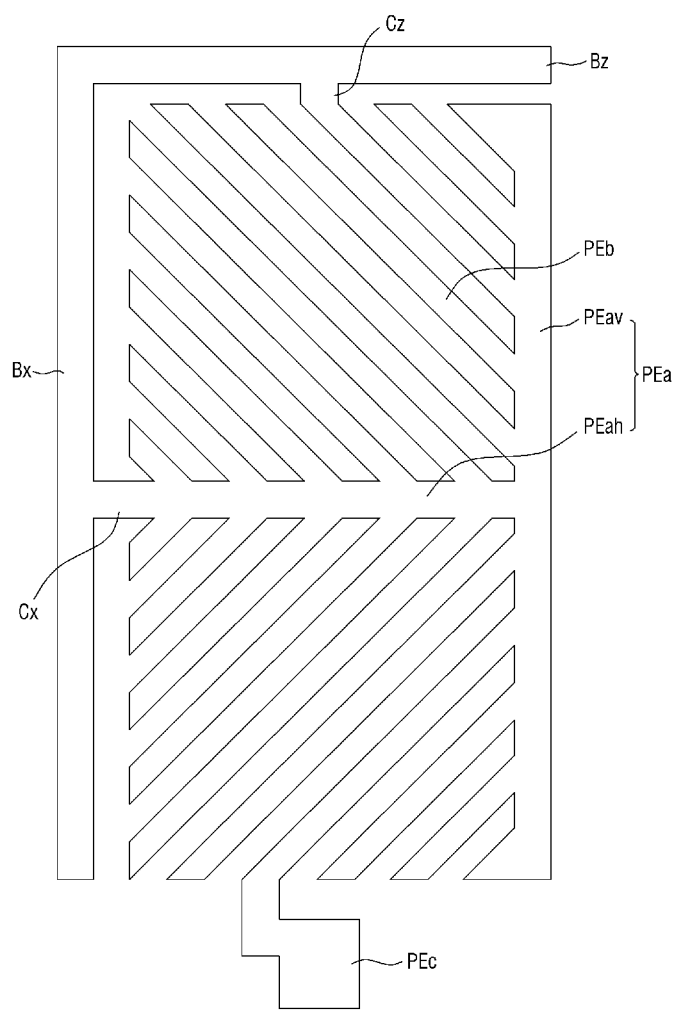

Referring to FIGS. 1, 5, 33, and 34, the exemplary embodiment of FIG. 34 is substantially the same as the exemplary embodiment of FIG. 33 except that a pixel electrode PE has no particular branch connector at an upper edge (or the third edge E3 of FIG. 5) thereof and includes a third conductive bar Bz, which faces the upper edge (or the third edge E3 of FIG. 5) of the pixel electrode PE, and a third connector Cz, which connects the pixel electrode PE and the third conductive bar Bz.

Figure 35:
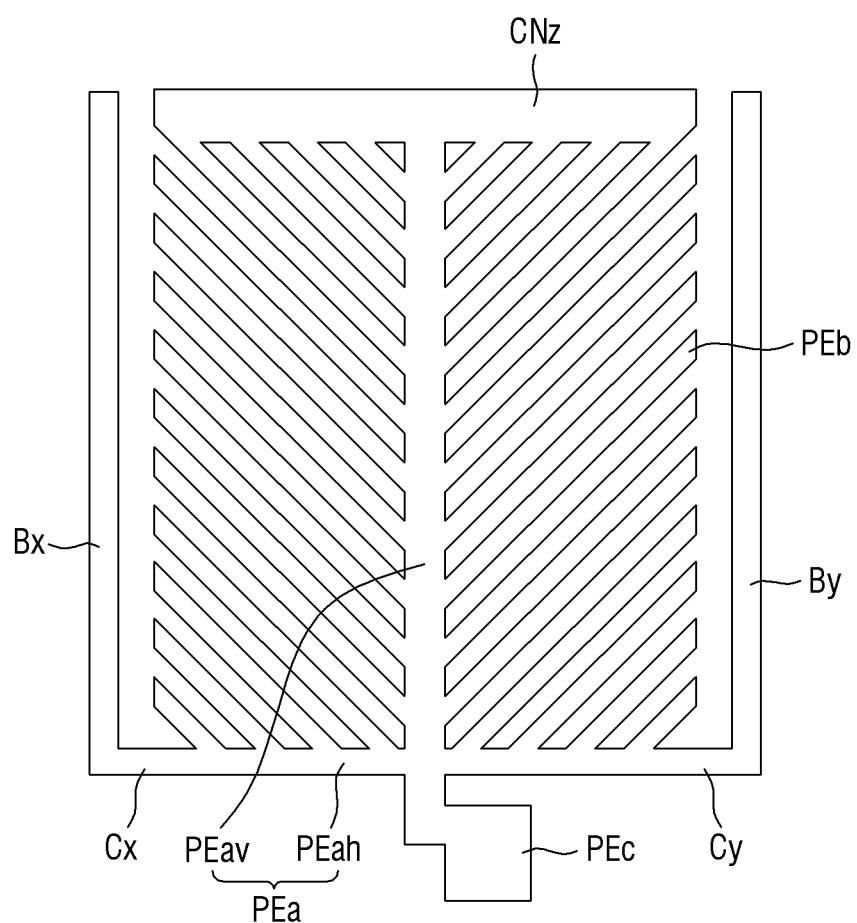

Referring to FIGS. 1, 5, and 35, the exemplary embodiment of FIG. 35 differs from the exemplary embodiment of FIG. 5 in that a pixel electrode PE is divided into two sub-regions. More specifically, the end of a vertical stem PEav and the end of a horizontal stem PEah may be connected to each other, and thus, a stem PEa may have a T shape or a T shape rotated 180 degrees. Accordingly, the pixel electrode PE may be divided into two sub-regions. FIG. 35 illustrates an example in which the stem PEa is in the form of a T shape rotated 180 degrees.

Branches PEb may extend from the stem PEa in an upper left direction or in an upper right direction. As mentioned above, the ends of some of the branches PEb may not be connected to one another.

A first conductive bar Bx, which faces the pixel electrode PE, may be disposed on a left edge (or the first edge E1 of FIG. 5) of the pixel electrode PE and may be connected to the pixel electrode PE via a first connector Cx. A second conductive bar By, which faces the pixel electrode PE, may be disposed on a right edge (or the second edge E2) of the pixel electrode PE and may be connected to the pixel electrode PE via a second connector Cy.

A branch connector CNz, which connects the ends of the branches PEb, may be disposed on an upper edge (or the third edge E3 of FIG. 5) of the pixel electrode PE.

Figure 36:
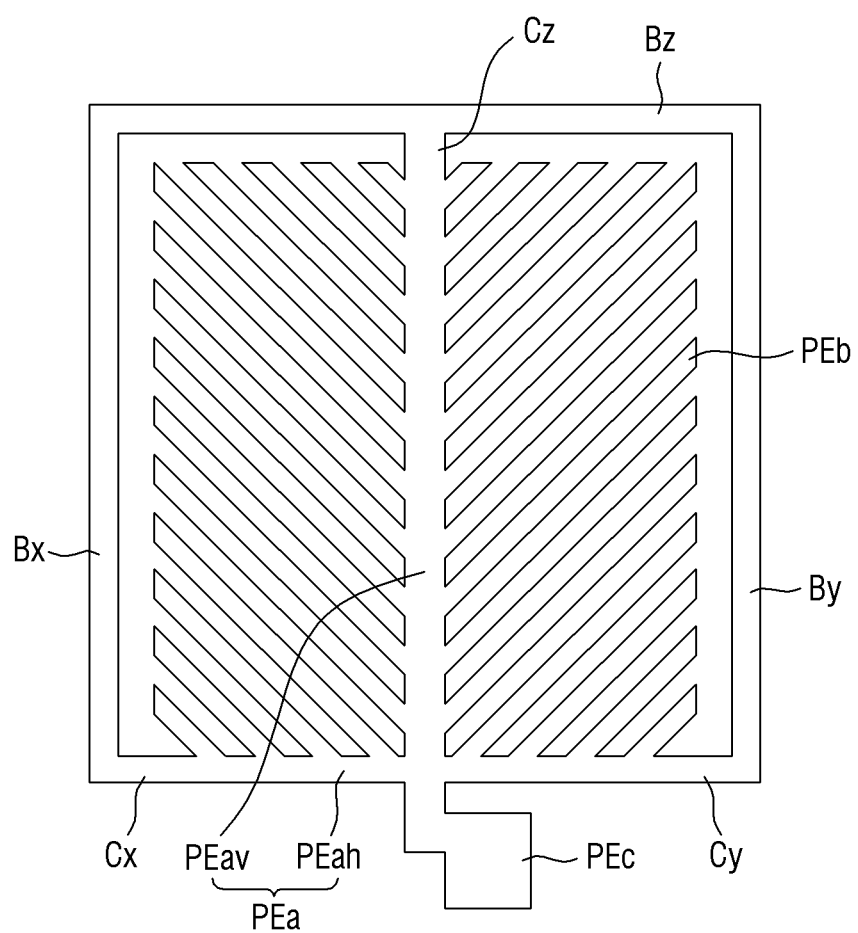

Referring to FIGS. 1, 5, 35, and 36, the exemplary embodiment of FIG. 36 is substantially the same as the exemplary embodiment of FIG. 35 except that a pixel electrode PE has no particular branch connector at an upper edge (or the third edge E3 of FIG. 5) thereof and includes a third conductive bar Bz, which faces the upper edge (or the third edge E3 of FIG. 5) of the pixel electrode PE, and a third connector Cz, which connects the pixel electrode PE and the third conductive bar Bz.

Figure 37:
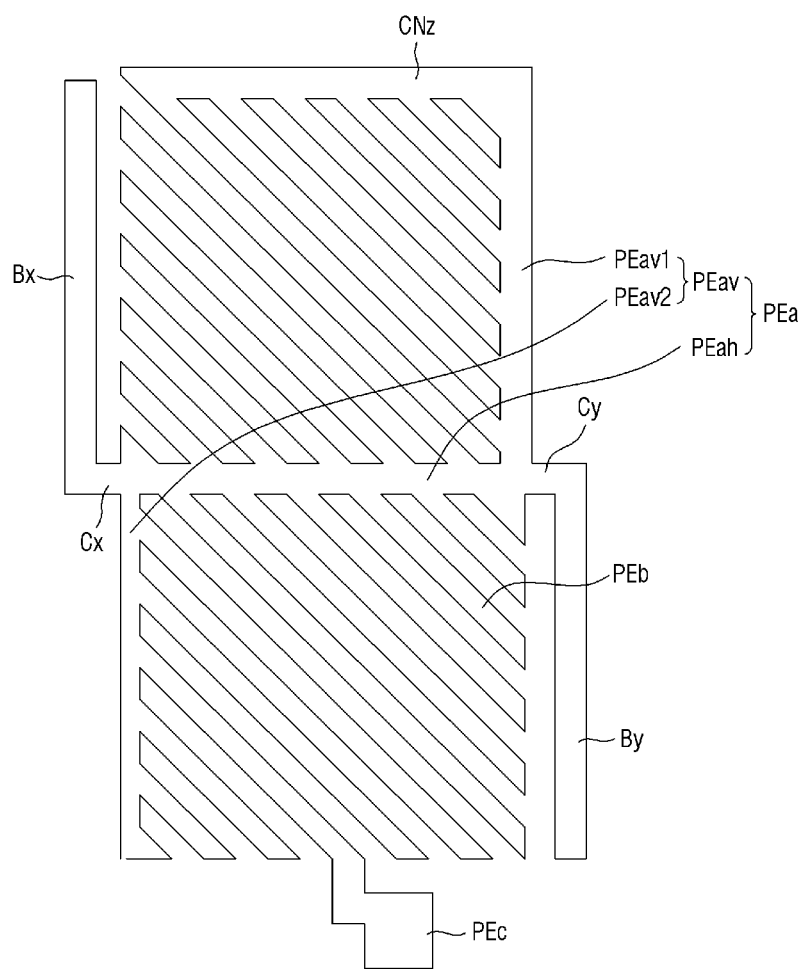

Referring to FIGS. 1, 5, and 37, the exemplary embodiment of FIG. 37 differs from the exemplary embodiment of FIG. 5 in that a pixel electrode PE is divided into two sub-regions. More specifically, a vertical stem PEav may include a first vertical stem portion PEav1 and a second stem portion PEav2. The first vertical stem portion PEav1 may be connected to one end of a horizontal stem PEah and may extend upwardly. The second vertical stem portion PEav2 may be connected to the other end of the horizontal stem PEah and may extend downwardly. Accordingly, a stem PEa may divide the pixel electrode PE into two sub-regions.

Branches PEb may extend from the stem PEa in an upper left direction or in a lower right direction. As mentioned above, the ends of some of the branches PEb may not be connected to one another.

A first conductive bar Bx, which faces the pixel electrode PE, may be disposed on a left edge (or the first edge E1 of FIG. 5) of the pixel electrode PE and may be connected to the pixel electrode PE via a first connector Cx. A second conductive bar By, which faces the pixel electrode PE, may be disposed on a right edge (or the second edge E2) of the pixel electrode PE and may be connected to the pixel electrode PE via a second connector Cy. In exemplary embodiments, the first and second conductive bars Bx and By may be disposed to face the branches PEb, but not to face the vertical stems PEav.

In an exemplary embodiment, a branch connector CNz, which connects the ends of the branches PEb, may be disposed on an upper edge (or the third edge E3 of FIG. 5) of the pixel electrode PE.

Figure 38:
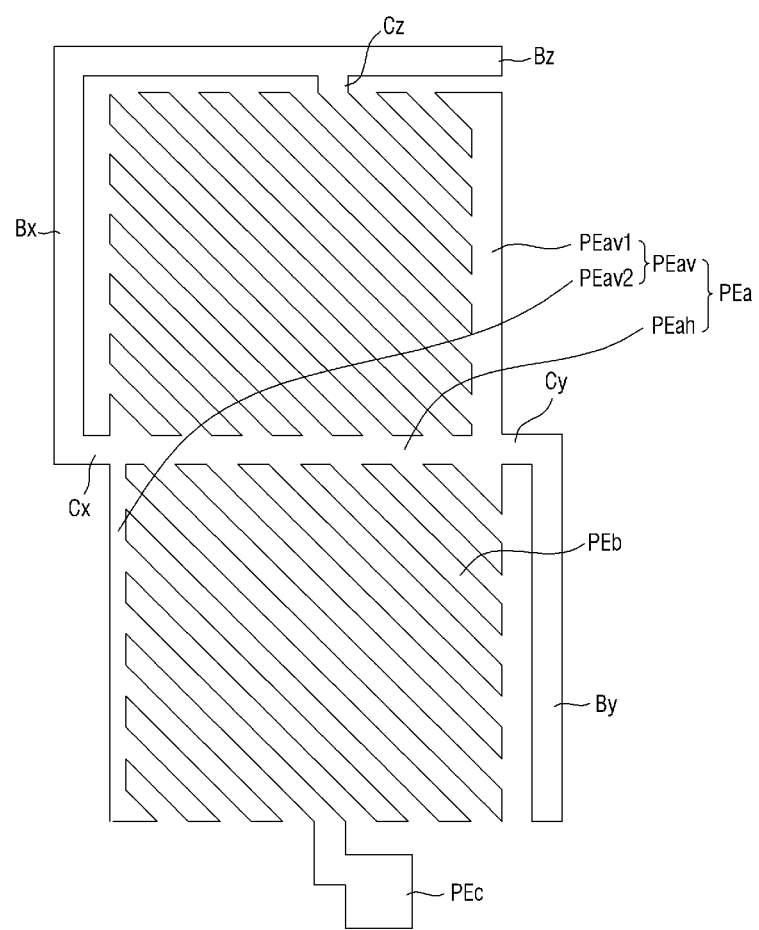

Referring to FIGS. 1, 5, 37, and 38, the exemplary embodiment of FIG. 38 is substantially the same as the exemplary embodiment of FIG. 37 except that a pixel electrode PE has no particular branch connector at an upper edge (or the third edge E3 of FIG. 5) thereof and includes a third conductive bar Bz, which faces the upper edge (or the third edge E3 of FIG. 5) of the pixel electrode PE, and a third connector Cz, which connects the pixel electrode PE and the third conductive bar Bz.

Figure 39:
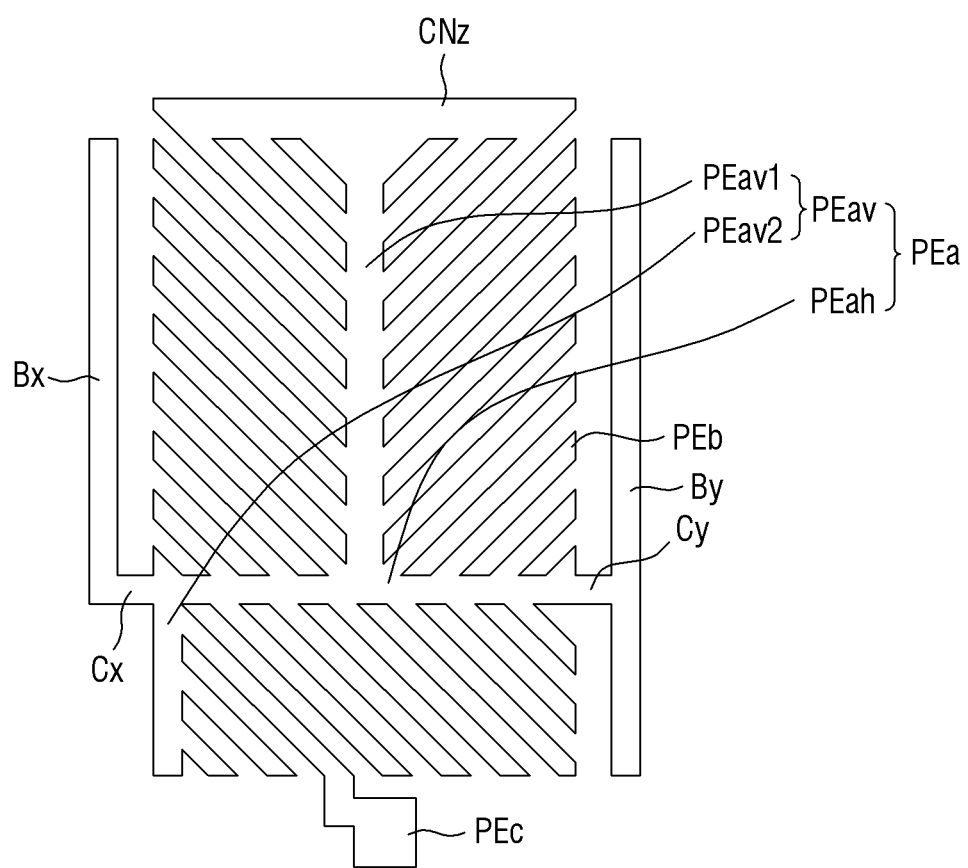

Referring to FIGS. 1, 5, and 39, the exemplary embodiment of FIG. 39 differs from the exemplary embodiment of FIG. 5 in that a pixel electrode PE is divided into three sub-regions. More specifically, vertical stems PEav may include a first vertical stem portion PEav1 and a second stem portion PEav2. In an exemplary embodiment, the first vertical stem portion PEav1 may be connected to a horizontal stem PEah and may have a T shape or a T shape rotated 180 degrees, for example. The second vertical stem portion PEav2 may be connected to one end of the horizontal stem PEah and may extend in an opposite direction to a direction in which the first vertical stem portion PEav1 extends. Accordingly, a stem PEa may divide the pixel electrode PE into three sub-regions.

Branches PEb may extend from the stem PEa in an upper left direction, in an upper right direction, or in a lower right direction. As mentioned above, the ends of some of the branches PEb may not be connected to one another.

A first conductive bar Bx, which faces the pixel electrode PE, may be disposed on a left edge (or the first edge E1 of FIG. 5) of the pixel electrode PE and may be connected to the pixel electrode PE via a first connector Cx. A second conductive bar By, which faces the pixel electrode PE, may be disposed on a right edge (or the second edge E2) of the pixel electrode PE and may be connected to the pixel electrode PE via a second connector Cy. In exemplary embodiments, the first and second conductive bars Bx and By may be disposed to face the branches PEb, but not to face the vertical stems PEav.

A branch connector CNz, which connects the ends of the branches PEb, may be disposed on an upper edge (or the third edge E3 of FIG. 5) of the pixel electrode PE.

Figure 40:
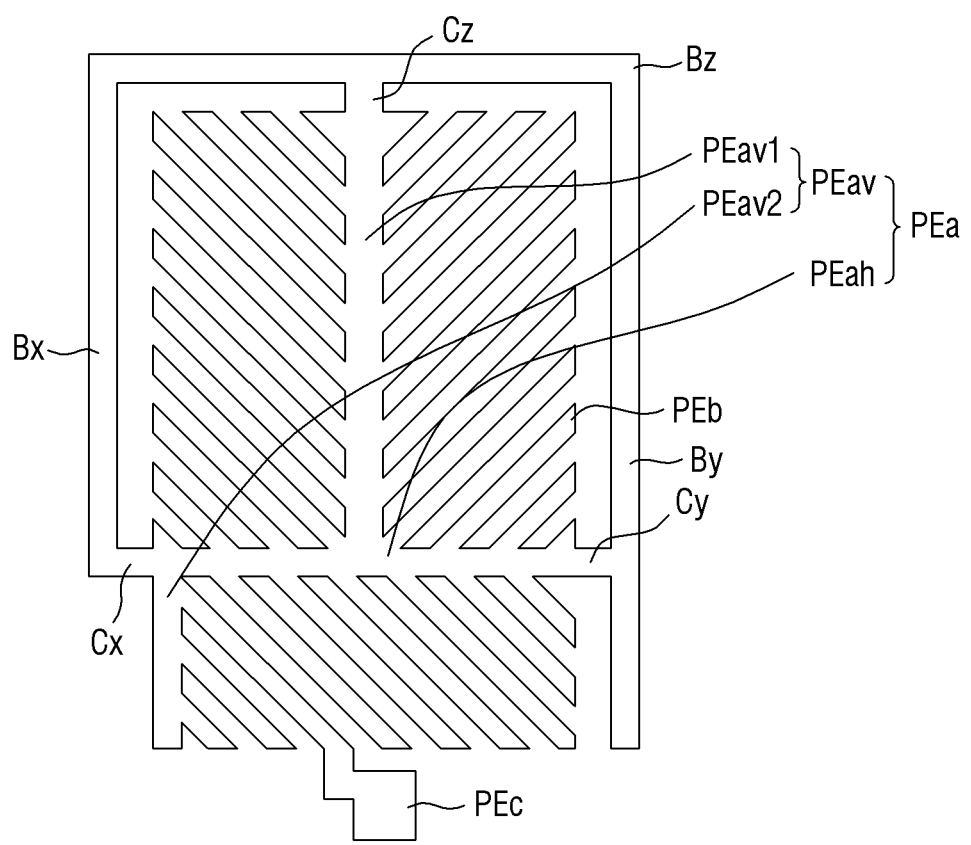

Referring to FIGS. 1, 5, 39, and 40, the exemplary embodiment of FIG. 40 is substantially the same as the exemplary embodiment of FIG. 39 except that a pixel electrode PE has no particular branch connector at an upper edge (or the third edge E3 of FIG. 5) thereof and includes a third conductive bar Bz, which faces the upper edge (or the third edge E3 of FIG. 5) of the pixel electrode PE, and a third connector Cz, which connects the pixel electrode PE and the third conductive bar Bz.

In the exemplary embodiments of FIGS. 31 through 40, the planar shape of the pixel electrode PE may be changed in a similar manner to that of the exemplary embodiments of FIGS. 29 and 30 such that the distances between the edges of the pixel electrode PE and the conductive bars (Bx and By) may vary.

Figure 41:
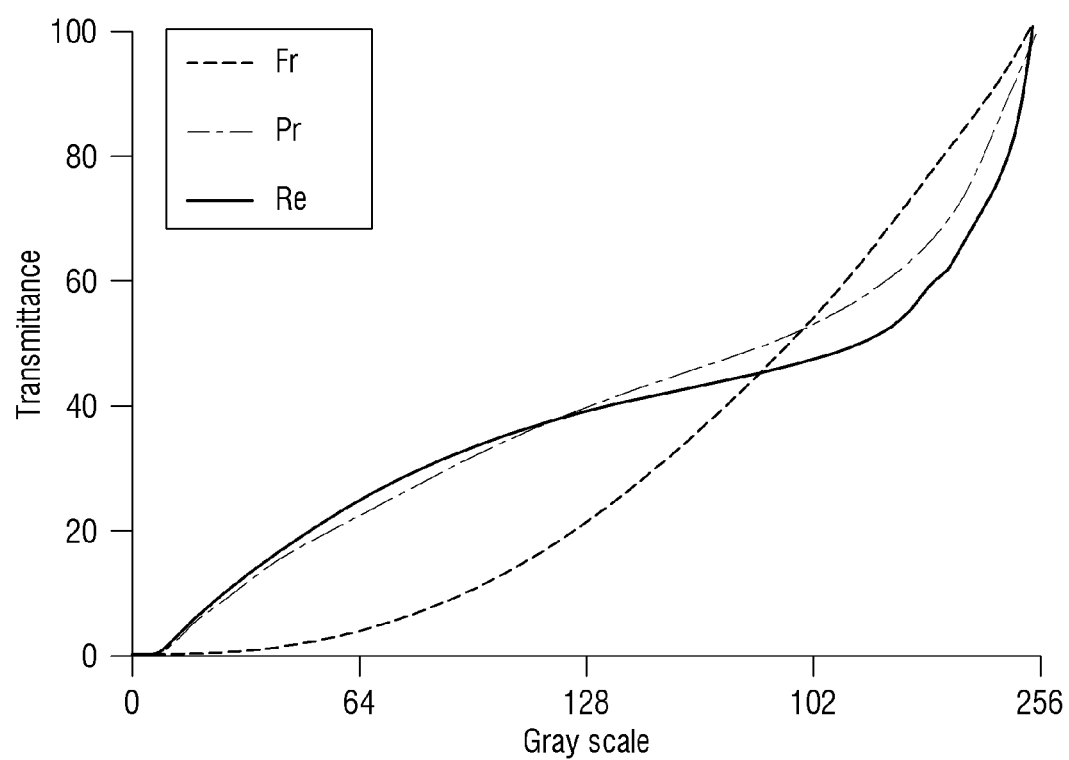
FIG. 41 is a graph showing a side gamma curve of the LCD device of FIG. 1.

FIG. 41 is a graph showing a side gamma curve of an LCD device according to an exemplary embodiment of the invention, and particularly, the LCD device according to the exemplary embodiment of FIG. 1. Referring to FIG. 41, "Fr" represents a front gamma curve, "Re" represents a side gamma curve of an LCD device according to a comparative example, which does not include conductive bars, and "Pr" represents a side gamma curve of the LCD device 1.

As shown in FIG. 41, the side gamma curve Pr of the LCD device 1, which includes conductive bars, is closer to the front gamma curve Fr than the side gamma curve Re of the LCD device according to the comparative example is, and as a result, the LCD device 1 may have improved side visibility, compared to the LCD device according to the comparative example. Also, since the LCD device 1 includes conductive bars, the side gamma curve Pr of the LCD device 1 becomes relatively gentler than the side gamma curve Re of the LCD device according to the comparative example. Accordingly, rapid color changes that may occur at the sides of the LCD device 1 may be prevented, and as a result, color distortion may be improved.

In FIGS. 1 through 42, the same reference numerals will be assigned to the same elements, and detailed descriptions thereof will be omitted.

Figure 42:
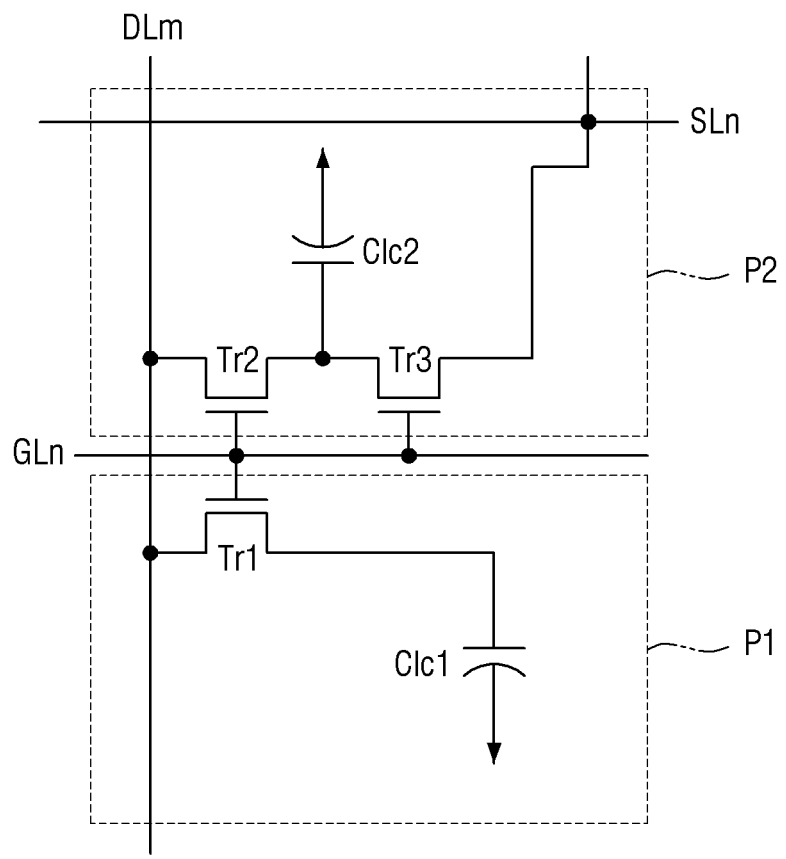
FIG. 42 is an equivalent circuit diagram of another exemplary embodiment of a pixel of an LCD device according to the invention.

FIG. 42 is an equivalent circuit diagram of a pixel of an LCD device according to another exemplary embodiment of the invention.

Referring to FIG. 42, a pixel of an LCD device according to another exemplary embodiment of the invention may include two sub-pixels (P1 and P2). The pixel may include a gate line GLn, which transmits a gate signal, a data line DLm, which transmits a data voltage, a sustain electrode line SLn, to which a predetermined sustain voltage is applied, a first TFT Tr1, a second TFT Tr2, and a third TFT Tr3.

The first and second TFTs Tr1 and Tr2 may be connected to the same gate line, i.e., the gate line GLn, and the same data line, i.e., the data line DLm. The third TFT Tr3 may be connected to the same gate line as the first and second TFTs Tr1 and Tr2, i.e., the gate line GLn, and may also be connected to the second TFT Tr2 and the sustain electrode line SLn.

A first liquid crystal capacitor Clca, which is connected to the first TFT Tr1, is provided in the first sub-pixel P1, and a second liquid crystal capacitor Clcb, which is connected to the second TFT Tr2, is provided in the second sub-pixel P2.

The first TFT Tr1 may be included in the first sub-pixel P1, and the second and third TFTs Tr2 and Tr3 may be included in the second sub-pixel P2.

A first terminal of the first TFT Tr1 may be connected to the gate line GLn, a second terminal of the first TFT Tr1 may be connected to the data line DLm, and a third terminal of the first TFT Tr1 may be connected to the first liquid crystal capacitor Clc1.

The third terminal of the first TFT Tr1 may be connected to a first sub-pixel electrode (not illustrated), which forms the first liquid crystal capacitor Clc1.

A first terminal of the second TFT Tr2 may be connected to the gate line GLn, a second terminal of the second TFT Tr2 may be connected to the data line DLm, and a third terminal of the second TFT Tr2 may be connected to the second liquid crystal capacitor Clc2.

The third terminal of the second TFT Tr2 may be connected to a second sub-pixel electrode (not illustrated), which forms the second liquid crystal capacitor Clc2.

A first terminal of the third TFT Tr3 may be connected to the gate line GLn, a second terminal of the third TFT Tr3 may be connected to the sustain electrode line SLn, and a third terminal of the third TFT Tr3 may be connected to the third terminal of the second TFT Tr2.

The operation of the LCD device according to the exemplary embodiment of FIG. 42 will hereinafter be described. In response to a gate-on voltage being applied to the gate line GLn, the first, second, and third TFTs Tr1, Tr2, and Tr3, which are connected to the gate line GLn, may all be turned on, and the first and second liquid crystal capacitors Clc1 and Clc2 may be charged with the data voltage transmitted by the data line DLm. The same data voltage is applied to both the first and second sub-pixel electrodes, and the first and second liquid crystal capacitors Clc1 and Clc2 may be charged to the same level, i.e., a level corresponding to the difference between a common voltage and the data voltage.

Since the third TFT Tr3 is in an on state, the data voltage transmitted to the second sub-pixel via the data line DLm may be divided by the third TFT Tr3, which is connected in series to the second TFT Tr2. The data voltage may be divided between the second and third TFTs Tr2 and Tr3 according to the sizes of the channels of the second and third TFTs Tr2 and Tr3. Thus, even when the same data voltage is transmitted to the first and second sub-pixels P1 and P2 via the data line DLm, the first and second liquid crystal capacitors Clc1 and Clc2 may be charged with different voltages. That is, the voltage that the second liquid crystal capacitor Clc2 is charged with may be lower than the voltage that the first liquid crystal capacitor Clc1 is charged with.

Accordingly, the side visibility of an LCD device may be improved by making the voltage that the first sub-pixel P1 is charged with and the voltage that the second sub-pixel P2 is charged with differ from each other. The sustain voltage may be higher than the common voltage. In an exemplary embodiment, when the common voltage is about 7 volts (V), the sustain voltage may be about 8 V, for example, but the invention is not limited thereto.

In FIGS. 1 through 46, the same reference numerals will be assigned to the same elements, and detailed descriptions thereof will be omitted.

Figure 43:
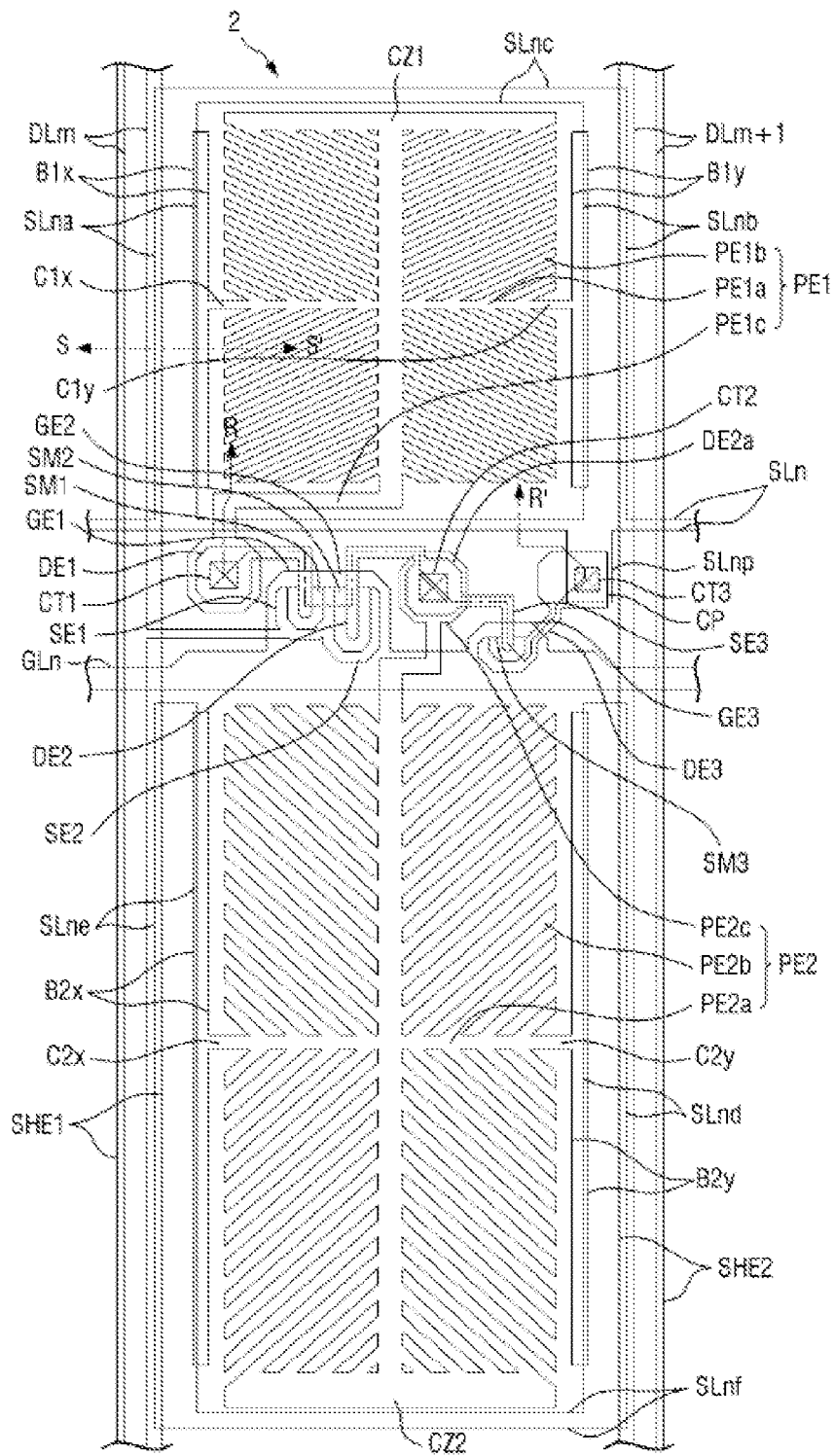
FIG. 43 is a schematic plan view of an exemplary embodiment of an array substrate, e.g., a pixel of the array substrate, included in the LCD device according to the invention.
Figure 44:
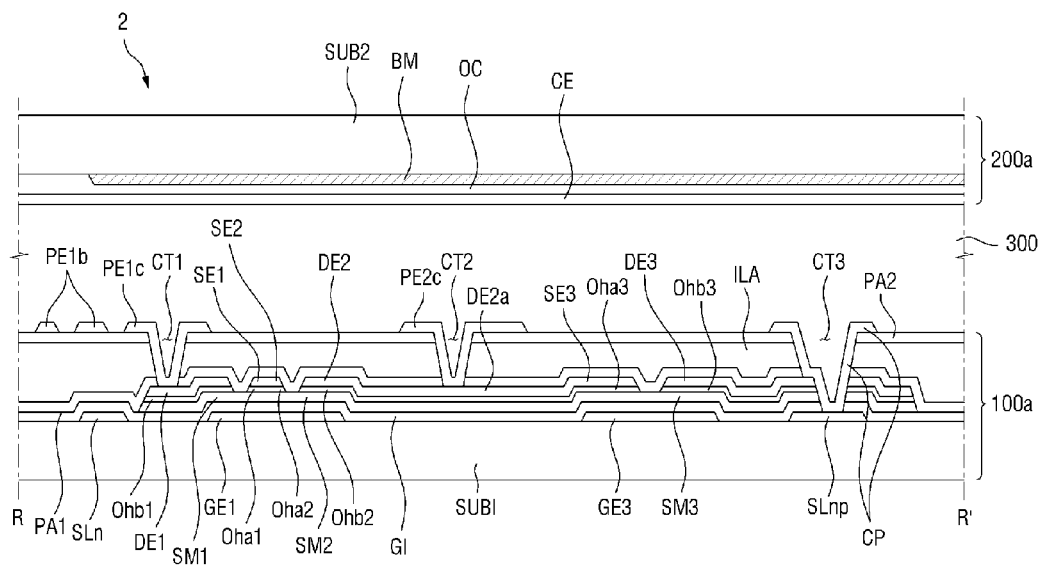
FIG. 44 is a schematic cross-sectional view taken along line R-R' of FIG. 43.
Figure 45:
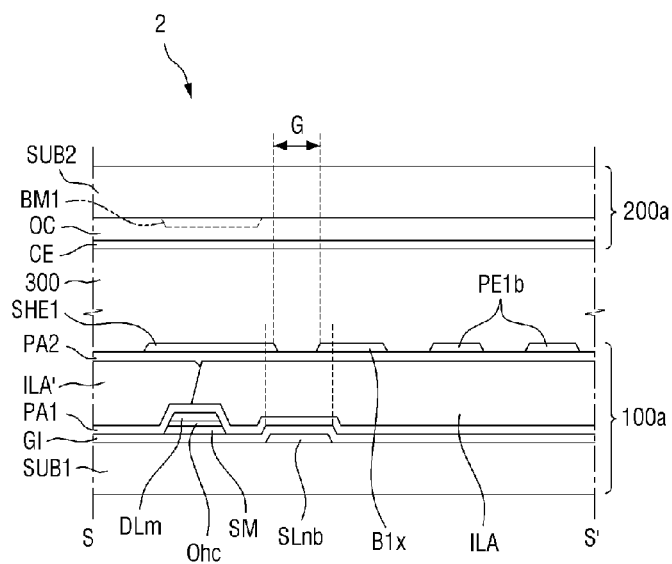
FIG. 45 is a schematic cross-sectional view taken along line S-S' of FIG. 43.
Figure 46:
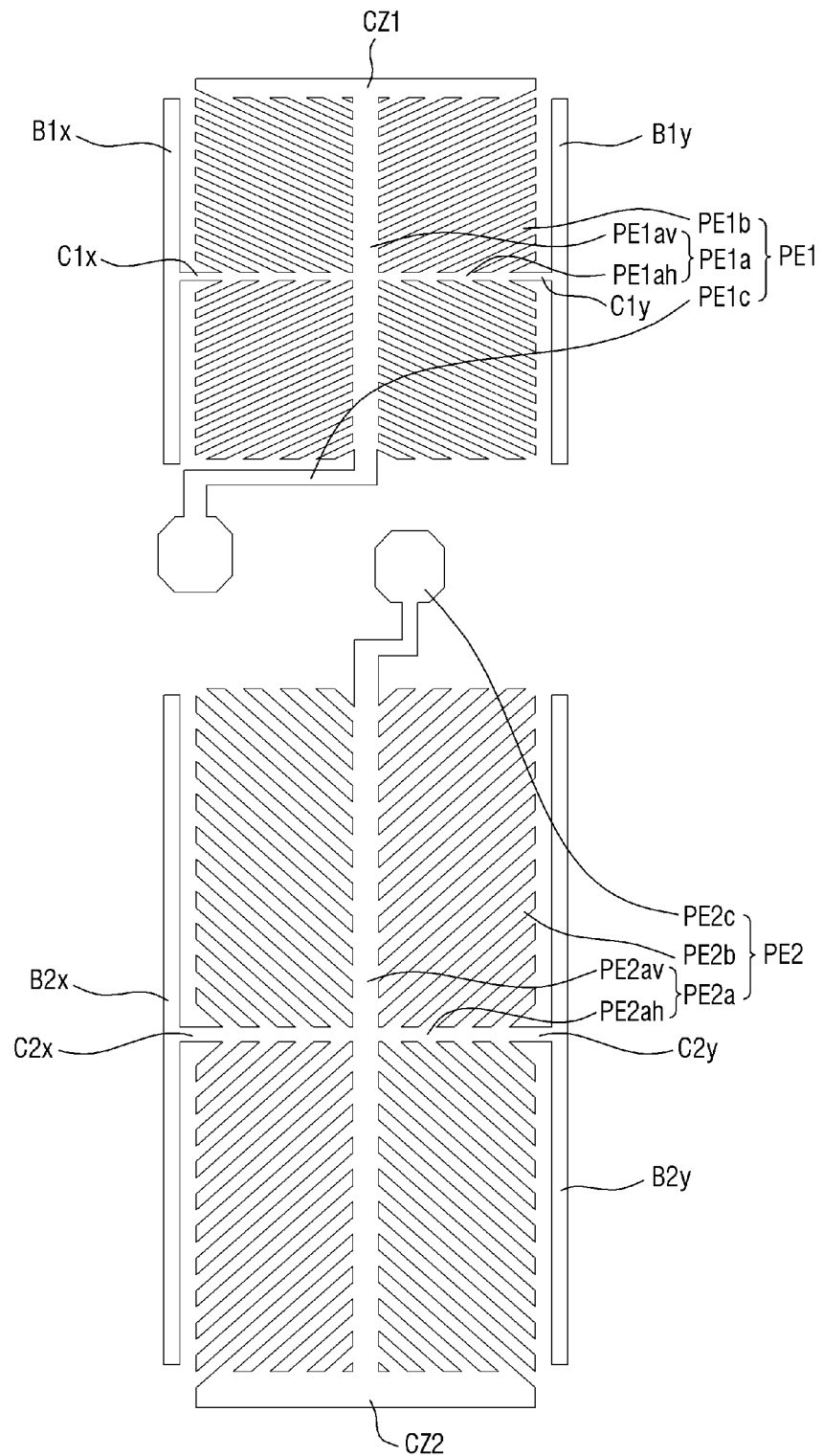
FIG. 46 is a schematic plan view illustrating a pixel electrode and bar-type conductors of FIG. 43.

FIG. 43 is a schematic plan view of an array substrate included in the LCD device according to an exemplary embodiment of the invention, and particularly, the LCD device according to the exemplary embodiment of FIG. 42, FIG. 44 is a schematic cross-sectional view taken along line R-R' of FIG. 43, FIG. 45 is a schematic cross-sectional view taken along line S-S' of FIG. 43, and FIG. 46 is a schematic plan view illustrating a pixel electrode and bar-type conductors of FIG. 43.

Referring to FIGS. 43 through 46, an LCD device 2 may include an array substrate 100a, a counter substrate 200a, which faces the array substrate 100a, and a liquid crystal layer 300, which is disposed between the array substrate 100a and the counter substrate 200a, and may further include a pair of polarizers (not illustrated), which are respectively attached on the outer surfaces of the array substrate 100a and the counter substrate 200a.

The array substrate 100a will hereinafter be described.

In an exemplary embodiment, a gate line GLn may be disposed on a first base unit SUB1, which includes a transparent glass or plastic material, for example. The gate line GLn extends substantially in a first direction (e.g., a horizontal direction) and transmits a gate signal.

A first gate electrode GE1 and a second gate electrode GE2, which protrude from the gate line GLn and are connected to each other, may be disposed on the first base unit SUB1. A third gate electrode GE3, which also protrudes from the gate line GLn and is isolated from the first and second gate electrodes GE1 and GE2, may be disposed. The first, second, and third gate electrodes GE1, GE2, and GE3 may all be connected to the same gate line, i.e., the gate line GLn, and the same gate signal may be applied to the first, second, and third gate electrodes GE1, GE2, and GE3.

A gate insulating layer GI may be disposed on the gate line GLn and the first, second, and third gate electrodes GE1, GE2, and GE3. In an exemplary embodiment, the gate insulating layer GI may include an inorganic insulating material such as silicon oxide, silicon nitride, or silicon oxynitride. The gate insulating layer GI may have a single-layer structure or a multilayer structure.

A first semiconductor layer SM1, a second semiconductor layer SM2, and a third semiconductor layer SM3 may be disposed on the gate insulating layer GI. More specifically, the first semiconductor layer SM1 may be disposed above the first gate electrode GE1, the second semiconductor layer SM2 may be disposed above the second gate electrode GE2, and the third semiconductor layer SM3 may be disposed above the third gate electrode GE3. In an exemplary embodiment, the first, second, and third semiconductor layers SM1, SM2, and SM3 may comprise amorphous silicon, polycrystalline silicon, or an oxide semiconductor, for example.

A plurality of ohmic contact members (Oha1, Oha2, Oha3, Ohb1, Ohb2, Ohb3, and Ohc) may be disposed on the first, second, and third semiconductor layers SM1, SM2, and SM3. The ohmic contact members (Oha1, Oha2, Oha3, Ohb1, Ohb2, Ohb3, and Ohc) may include source ohmic contact members Oha1, Oha2, and Oha3, which are disposed below first, second, and third source electrodes SE1, SE2, and SE3, respectively, that will be described later, drain ohmic contact members Ohb1, Ohb2, and Ohb3, which are disposed below first, second, and third drain electrodes DE1, DE2, and DE3, respectively, that will be described later, and a data ohmic contact member Ohc, which is disposed below data lines DLm and DLm+1. In exemplary embodiments, when the first, second, and third semiconductor layers SM1, SM2, and SM3 comprise an oxide semiconductor, the ohmic contact members (Oha1, Oha2, Oha3, Ohb1, Ohb2, Ohb3, and Ohc) may not be provided.

The data lines (DLm and DLm+1), the first source electrode SE1, the first drain electrode DE1, the second source electrode SE2, the second drain electrode DE2, the third source electrode SE3, and the third drain electrode DE3 may be disposed on the ohmic contact members (Oha1, Oha2, Oha3, Ohb1, Ohb2, Ohb3, and Ohc) and the gate insulating layer GI.

The data lines (DLm and DLm+1) may transmit data voltages and may extend substantially in a second direction (e.g., a vertical direction) to cross the gate line GLn.

The first source electrode SE1 is provided to protrude from the data line DLm to the top of the first gate electrode GE1. In exemplary embodiments, a part of the first source electrode SE1 above the first gate electrode GE1 may be bent in a C shape, but the invention is not limited thereto.

The first drain electrode DE1 is provided to be isolated from the first source electrode SE1 above the first gate electrode GE1. The first drain electrode DE1 and the first source electrode SE1 may be connected to the first semiconductor layer SM1.

The second source electrode SE2 is provided to protrude from the data line DLm to the top of the second gate electrode GE2. In exemplary embodiments, a part of the second source electrode SE2 above the second gate electrode GE2 may be bent in a C shape, for example, but the invention is not limited thereto.

The second drain electrode DE2 is provided to be isolated from the second source electrode SE2 above the second gate electrode GE2. The second drain electrode DE2 and the second source electrode SE2 may be connected to the second semiconductor layer SM2.

The third source electrode SE3 is connected to the second drain electrode DE2 and is provided to be isolated from the third drain electrode DE3 above the third gate electrode GE3. The third drain electrode DE3 and the third source electrode SE3 may be connected to the third semiconductor layer SM3.

The third drain electrode DE3 is provided to protrude over the third gate electrode GE3. The third drain electrode DE3 may be connected to a sustain electrode line SLn that will be described later, and may receive a predetermined voltage, for example, a sustain voltage.

The first gate electrode GE1, the first semiconductor layer SM1, the first source electrode SE1, and the first drain electrode DE1 form a first TFT (Tr1 of FIG. 32). The second gate electrode GE2, the second semiconductor layer SM2, the second source electrode SE2, and the second drain electrode DE2 form a second TFT (Tr2 of FIG. 32). The third gate electrode GE3, the third semiconductor layer SM3, the third source electrode SE3, and the third drain electrode DE3 form a third TFT (Tr3 of FIG. 32).

A first passivation layer PA1 may be disposed on the data lines DLm and DLm+1, the first, second, and third source electrodes SE1, SE2, and SE3, and the first, second, and third drain electrodes DE1, DE2, and DE3. The first passivation layer PA1 may include an organic insulating material or an inorganic insulating material. The first passivation layer PA1 may protect the first, second, and third TFTs Tr1, Tr2, and Tr3 and may prevent a material included in an organic layer ILA that will be described later from infiltrating into the first, second, and third semiconductor layers SM1, SM2, and SM3.

The organic layer ILA may be disposed on the first passivation layer PA1. In exemplary embodiments, the organic layer ILA may have a function of planarizing the top of the first passivation layer PA1. The organic layer ILA may comprise an organic material. The organic layer ILA may further comprise a color pigment. In an exemplary embodiment, the organic layer ILA may comprise a color pigment allowing the transmission of light of a particular color wavelength, for example. That is, the organic layer ILA may be a color filter. When the organic layer ILA comprises a color pigment, the organic layer ILA may at least partially overlap an insulating layer ILA' of a neighboring pixel over the data lines DLm and DLm+1. For convenience, in the following description, it is assumed that the organic layer ILA is a color filter.

A second passivation layer PA2 may be disposed on the organic layer ILA. In an exemplary embodiment, the second passivation layer PA2 may comprise an inorganic insulating material such as silicon oxide, silicon nitride, or silicon oxynitride. The second passivation layer PA2 may prevent the organic layer ILA from being lifted off from the underlying layer and may suppress the contamination of the liquid crystal layer 300 by an organic material such as a solvent from the organic layer ILA.

A first contact hole CT1, which exposes a part of the first drain electrode DE1, a second contact hole CT2, which exposes a part of the second drain electrode DE2, and a third contact hole CT3, which exposes a part of the third drain electrode DE3 and a sustain electrode extension SLnp that will be described later, may be provided in the first passivation layer PA1, the organic layer ILA, and the second passivation layer PA2.

A pixel electrode (PE1 and PE2) may be disposed on the organic layer ILA and the second passivation layer PA2. The pixel electrode (PE1 and PE2) may include a first sub-pixel electrode PE1 and a second sub-pixel electrode PE2. The first sub-pixel electrode PE1 may be connected to the first drain electrode DE1 via the first contact hole CT1, and the second sub-pixel electrode PE2 may be connected to the second drain electrode DE2 via the second contact hole CT2.

The first and second sub-pixel electrodes PE1 and PE2 may receive data voltages from the first and second drain electrodes DE1 and DE2, respectively. In an exemplary embodiment, the third source electrode SE3 may be extended from a wide portion DE2a of the second drain electrode DE2 corresponding to the second contact hole CT2. A part of the data voltage applied to the second drain electrode DE2 may be divided by the third source electrode SE3, and thus, a second sub-pixel voltage applied to the second sub-pixel electrode PE2 may be lower than a first sub-pixel voltage applied to the first sub-pixel electrode PE1. This corresponds to a case in which the data voltages applied to the first and second sub-pixel electrodes PE1 and PE2 have positive polarity (+). When the data voltages applied to the first and second sub-pixel electrodes PE1 and PE2 have negative polarity (−), the first sub-pixel voltage applied to the first sub-pixel electrode PE1 may be lower than the second sub-pixel voltage applied to the second sub-pixel electrode PE2.

The first sub-pixel electrode PE1 may include a first stem PE1a, a plurality of first branches PE1b, which extend outwardly from the first stem PE1a, and a first projection PE1c, which is connected to the first drain electrode DE1, and may further include a first branch connector CZ1, which connects the ends of at least some of the first branches PE1b. The first stem PE1a may include a first horizontal stem PE1ah and a first vertical stem PE1ay.

The first stem PE1a, the first branches PE1b, the first projection PE1c, and the first branch connector CZ1 are the same as their respective counterparts of FIGS. 1 through 5, and thus, detailed descriptions thereof will be omitted.

As described above with reference to FIGS. 33 through 36, the ends of some of the first branches PE1b of the first sub-pixel electrode PE1 that face an upper conductive bar B1x or B1y that will be described later may not be connected to one another. In an alternative exemplary embodiment, differently from the exemplary embodiment illustrated in FIGS. 43 through 46, the ends of the first branches PE1b of the first sub-pixel electrode PE1 that face the upper conductive bar B1x or B1y may be at least partially connected to one another via an additional branch connector, in which case, the upper conductive bar B1x or B1y may face the additional branch connector.

The second sub-pixel electrode PE2 may include a second stem PE2a, a plurality of second branches PE2b, which extend outwardly from the second stem PE2a, and a second projection PE2c, which is connected to the second drain electrode DE2, and may further include a second branch connector CZ2, which connects the ends of at least some of the second branches PE2b. The second stem PE2a may include a second horizontal stem PE2ah and a second vertical stem PE2ay.

The second stem PE2a, the second branches PE2b, the second projection PE2c, and the second branch connector CZ2 are the same as their respective counterparts of FIGS. 1 through 5, and thus, detailed descriptions thereof will be omitted.

As described above with reference to FIGS. 33 through 36, the ends of some of the second branches PE2b of the second sub-pixel electrode PE2 that face a lower conductive bar B2x or B2y that will be described later may not be connected to one another. In an alternative exemplary embodiment, unlike what is illustrated in FIGS. 43 through 46, the ends of the second branches PE2b of the second sub-pixel electrode PE2 that face the lower conductive bar B2x or B2y may be at least partially connected to one another via an additional branch connector, in which case, the lower conductive bar B2x or B2y may face the additional branch connector.

The upper conductive bars (B1x and B1y), upper connectors (C1x and C1y), the lower conductive bars (B2x and B2y), and lower connectors (C2x and C1y) may be disposed on the second passivation layer PA2. The upper conductive bars (B1x and B1y) may be physically isolated from the first sub-pixel electrode PE1 and may be disposed on the same layer as that on which the first sub-pixel electrode PE1 is disposed. Similarly, the lower conductive bars (B2x and B2y) may be physically isolated from the second sub-pixel electrode PE2 and may be disposed on the same layer as that on which the second sub-pixel electrode PE2 is disposed. That is, the upper conductive bars (B1x and B1y) and the lower conductive bars (B2x and B2y), like the pixel electrode (PE1 and PE2), may be disposed directly on the second passivation layer PA2 and may thus directly contact the second passivation layer PA2.

The upper connectors (C1x and C1y) electrically connect the first sub-pixel electrode PE1 and the upper conductive bars (B1x and B1y). The upper connectors (C1x and C1y) may include a first upper connector C1x, which connects the first upper conductive bar B1x and the first sub-pixel electrode PE1, and a second upper connector C1y, which connects the second upper conductive bar B1y and the first sub-pixel electrode PE1.

Similarly, the lower connectors (C2x and C2y) electrically connect the second sub-pixel electrode PE2 and the lower conductive bars (B2x and B2y). The lower connectors (C2x and C2y) may include a first lower connector C2x, which connects the first lower upper conductive bar B2x and the second sub-pixel electrode PE2, and a second lower connector C2y, which connects the second lower conductive bar B2y and the second sub-pixel electrode PE2.

The rest of the descriptions of the upper conductive bars (B1x and B1y) and the lower conductive bars (B2x and B2y) are substantially the same as the descriptions of the conductive bars Bx and By according to any one of the exemplary embodiments of FIGS. 1 through 27, and the rest of the descriptions of the upper connectors (C1x and C1y) and the lower connectors (C2x and C2y) are substantially the same as the descriptions of the connectors (Cx and Cy) according to the exemplary embodiment of FIGS. 1 through 5. Thus, further detailed descriptions of the upper conductive bars (B1x and B1y), the lower conductive bars (B2x and B2y), the upper connectors (C1x and C1y), and the lower connectors (C2x and C2y) will be omitted.

Shielding electrodes (SHE1 and SHE2) may be disposed on the second passivation layer PA2. The shielding electrodes (SHE1 and SHE2) may be physically isolated and electrically insulated from the upper conductive bars (B1x and B1y), the lower conductive bars (B2x and B2y), and the pixel electrode (PE1 and PE2). The shielding electrodes (SHE1 and SHE2) may be disposed on the same layer as that on which the upper conductive bars (B1x and B1y), the lower conductive bars (B2x and B2y), and the pixel electrode (PE1 and PE2) are disposed, and may include the same material as that of the upper conductive bars (B1x and B1y), the lower conductive bars (B2x and B2y), and the pixel electrode (PE1 and PE2). The shielding electrodes (SHE1 and SHE2) may include a first shielding electrode SHE1, which overlaps the data line DLm, and a second shielding electrode SHE2, which overlaps the data line DLm+1.

The sustain electrode line SLn may be further disposed on the first base unit SUB1. The sustain electrode line SLn may extend substantially in the same direction (e.g., the horizontal direction) as the gate line GLn. The sustain electrode line SLn may be disposed to surround at least a part of the pixel electrode (PE1 and PE2). The sustain electrode line SLn may include first, second, and third sustain electrodes SLna, SLnb, and SLnc, which are disposed to surround a part of the first sub-pixel electrode PE1. The sustain electrode line SLn may further include the sustain electrode extension SLnp, which extends from the first or second sustain electrode SLna or SLnb. The sustain electrode line SLn may further include fourth, fifth, and sixth sustain electrodes SLNd, SLne, and SLnf, which are disposed to surround a part of the second sub-pixel electrode PE2. In exemplary embodiments, as seen in a plan view, the first and fifth sustain electrodes SLna and SLne may be disposed between the pixel electrode (PE1 and PE2) and the data line DLm, and the second and fourth sustain electrodes SLnb and SLnd may be disposed between the pixel electrode (PE1 and PE2) and the data line DLm+1.

In an exemplary embodiment, the sustain electrode line SLn may be disposed on the same layer as that on which the gate line GLn and the first, second, and third gate electrodes GE1, GE2, and GE3 are disposed, and may include the same material as that of the gate line GLn and the first, second, and third gate electrodes GE1, GE2, and GE3, for example. That is, the sustain electrode line SLn may be disposed between the first base unit SUB1 and the gate insulating layer GI and may include the same material as that of the gate line GLn.

The first sustain electrode SLna may cover a gap G between the first upper conductive bar B1x and the first shielding electrode SHE1. The first sustain electrode SLna may partially overlap the first upper conductive bar B1x or may also partially overlap the first shielding electrode SHE1.

Similarly, the second sustain electrode SLnb may cover a gap between the second upper conductive bar B1y and the second shielding electrode SHE2. The second sustain electrode SLnb may partially overlap the second upper conductive bar B1y or may also partially overlap the second shielding electrode SHE2.

Similarly, the fifth sustain electrode SLne may cover a gap between the first lower conductive bar B2x and the first shielding electrode SHE1. The fifth sustain electrode SLne may partially overlap the first lower conductive bar B2x or may also partially overlap the first shielding electrode SHE1.

Similarly, the fourth sustain electrode SLnd may cover a gap between the second lower conductive bar B2y and the second shielding electrode SHE2. The fourth sustain electrode SLnd may partially overlap the second lower conductive bar B2y or may also partially overlap the second shielding electrode SHE2.

A connecting pattern CP may be disposed on the second passivation layer PA2. The connecting pattern CP may electrically connect the sustain electrode extension SLnp and the third drain electrode DE3 via the third contact hole CT3. The connecting pattern CP may be disposed on the same layer as that on which the pixel electrode (PE1 and PE2) is disposed, and may include the same material as that of the pixel electrode (PE1 and PE2).

The counter substrate 200a will hereinafter be described.

The counter substrate 200a may include a second base unit SUB2, a light-shielding member BM, an overcoat layer OC, and a common electrode CE.

The second base unit SUB2, like the first base unit SUB1, may include a transparent insulating substrate. In an exemplary embodiment, the second base unit SUB2 may comprise a polymer or a plastic material having high thermal resistance, for example. In exemplary embodiments, the second base unit SUB2 may have flexibility.

The light-shielding member BM may be disposed on a surface of the second base unit SUB2 that faces the first base unit SUB1. In exemplary embodiments, the light-shielding member BM may have portions overlapping the gate line GLn and the first, second, and third TFTs Tr1, Tr2, and Tr3 and portions BM1 overlapping the data lines (DLm and DLm+1). The light-shielding member BM may comprise a light-shielding pigment such as black carbon or an opaque material such as Cr, and may further comprise a photosensitive organic material. The portions BM1 of the light-shielding member BM, which overlap the data lines (DLm and DLm+1), may not be provided.

The overcoat layer OC may be disposed on the second base unit SUB2 and the light-shielding member BM and may cover the light-shielding member BM. The overcoat layer OC may planarize a height difference provided by the light-shielding member BM. In other exemplary embodiments, the overcoat layer OC may not be provided as necessary.

The common electrode CE may be disposed on the overcoat layer OC. In exemplary embodiments, when the overcoat layer OC is not provided, the common electrode CE may be disposed on the second base unit SUB2 and the light-shielding member BM. In an exemplary embodiment, the common electrode CE includes a transparent conductive material such as ITO or IZO. In exemplary embodiments, the common electrode CE may be disposed on the entire surface of the second base unit SUB2. The common voltage may be applied to the common electrode CE, and thus, the common electrode CE may generate an electric field with the pixel electrode (PE1 and PE2).

Figure 47:
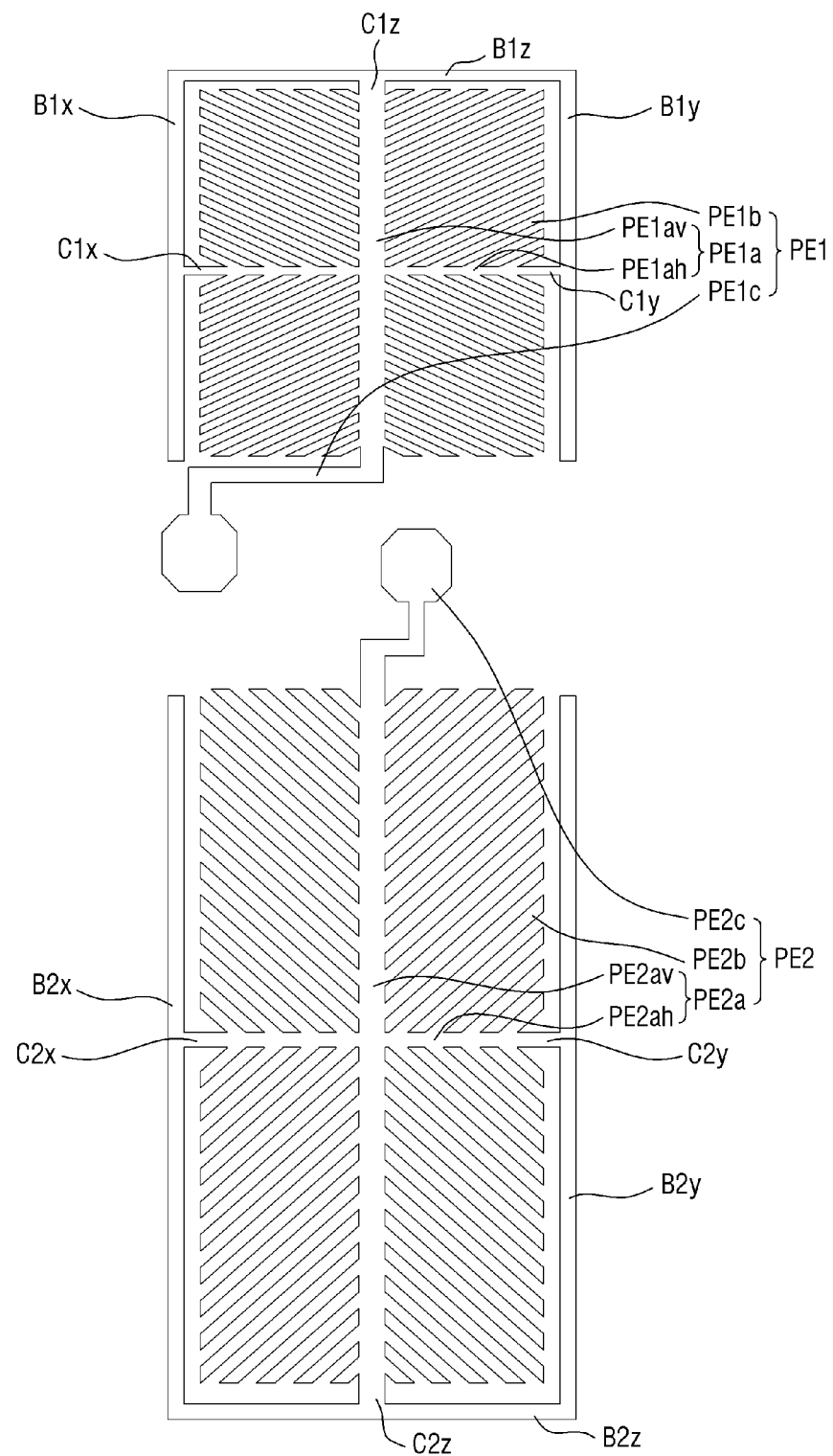
FIGS. 47 through 49 are schematic plan views of modifications of the pixel electrode and bar-shape conductors of the LCD device according to the exemplary embodiment of FIG. 42.
Figure 48:
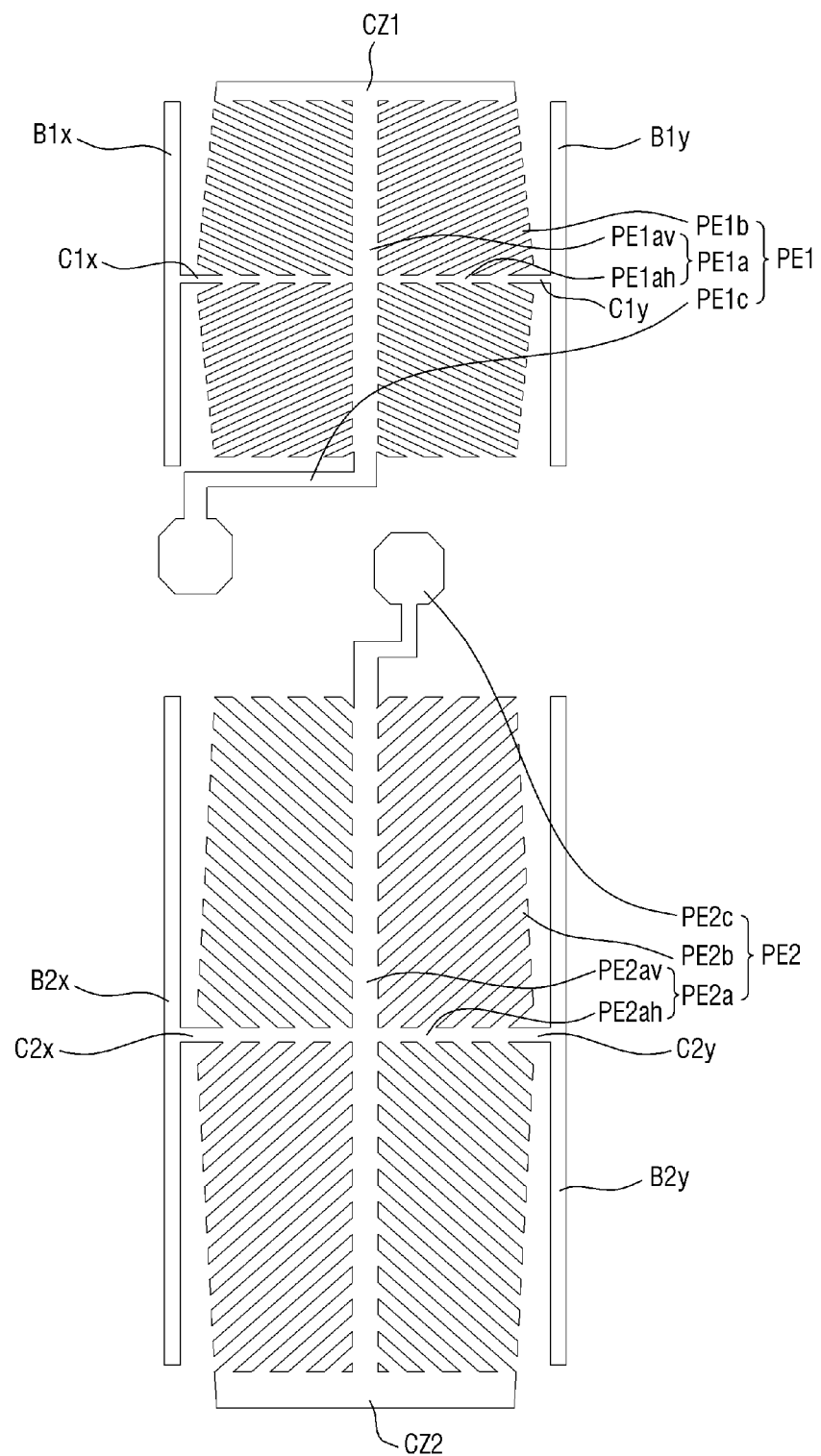
Figure 49:
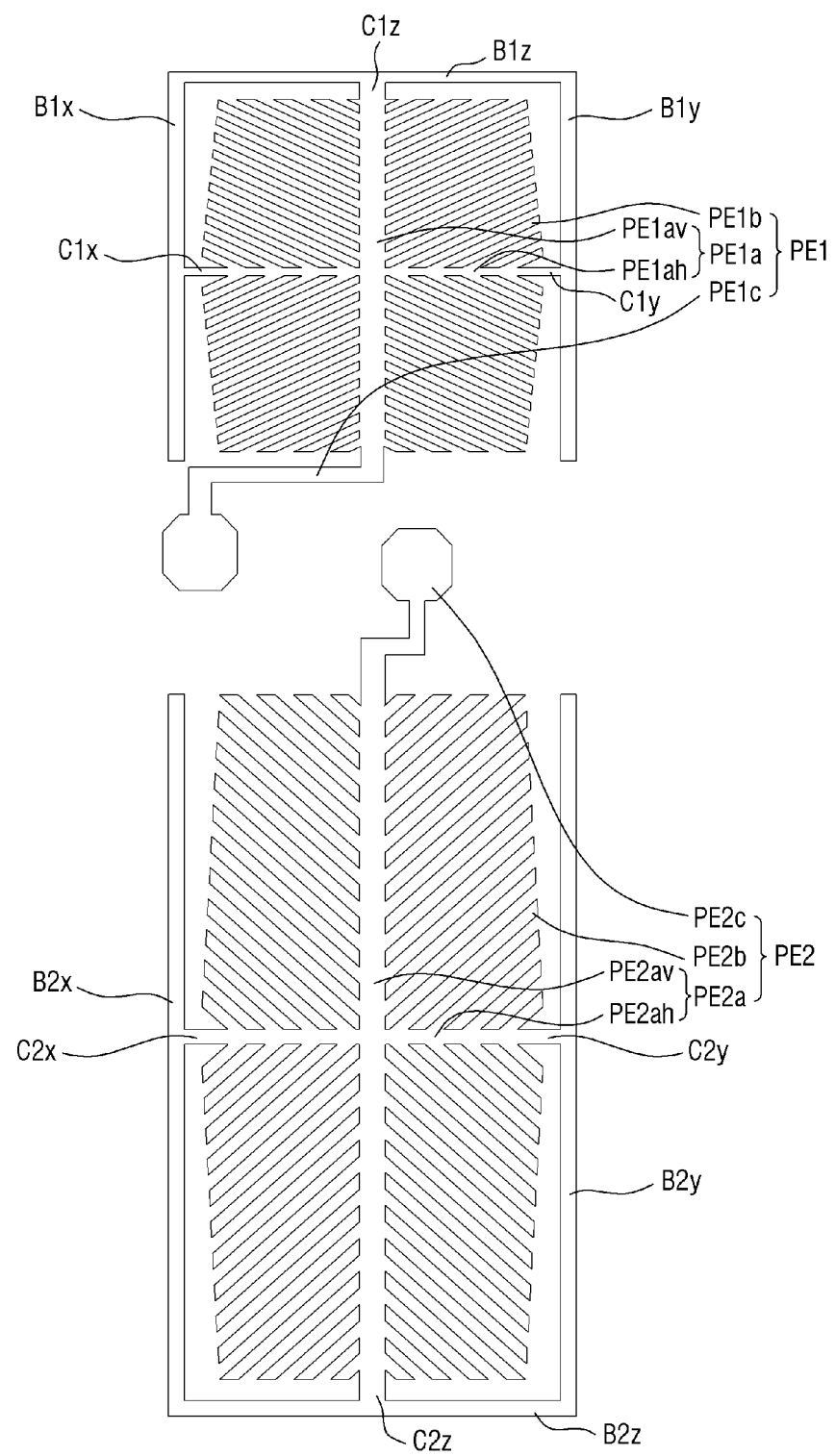

FIGS. 47 through 49 are schematic plan views of modifications of the pixel electrode and bar-shape conductors of the LCD device according to the exemplary embodiment of FIG. 42.

FIGS. 43, 46, and 47, the exemplary embodiment of FIG. 47 is substantially the same as the exemplary embodiment of FIGS. 43 and 46 except that each of first and second sub-pixel electrodes PE1 and PE2 has no particular branch connector, the first sub-pixel electrode PE1 includes a third upper conductive bar B1z, which is disposed on an upper edge of the first sub-pixel electrode PE1, and a third upper connector C1z, which connects the first sub-pixel electrode PE1 and the third upper conductive bar B1z, and the second sub-pixel electrode PE2 includes a third lower conductive bar B2z, which is disposed on a lower edge of the second sub-pixel electrode PE2, and a third lower connector C2z, which connects the second sub-pixel electrode PE2 and the third lower conductive bar B2z.

At least one of first and second upper connectors C1x and C1y and the third upper connector C1z may not be provided depending on how first and second upper conductive bars B1x and B1y and the third upper conductive bar B1z are connected to the first sub-pixel electrode PE1, and at least one of first and second lower connectors C2x and C2y and the third lower connector C2z may not be provided depending on how first and second lower conductive bars B2x and B2y and the third lower conductive bar B2z are connected to the second sub-pixel electrode PE2.

Referring to FIGS. 43, 46, and 48, the exemplary embodiment of FIG. 43 differs from the exemplary embodiment of FIGS. 43 and 46 in that the distances between the edges of a first sub-pixel electrode PE1 and upper conductive bars B1x and B1y may vary and the distances between the edges of a second sub-pixel electrode PE2 and lower conductive bars B2x and B2y may vary. A manner in which the distances between the edges of the first sub-pixel electrode PE1 and the upper conductive bars (B1x and B1y) or the distances between the edges of the second sub-pixel electrode PE2 and the lower conductive bars (B2x and B2y) vary is substantially the same as that described above with reference to FIG. 29, and thus, a detailed description thereof will be omitted.

Referring to FIGS. 43, 46, 48, and 49, the exemplary embodiment of FIG. 49 is substantially the same as the exemplary embodiment of FIG. 48 except that each of first and second sub-pixel electrodes PE1 and PE2 has no particular branch connector, the first sub-pixel electrode PE1 includes a third upper conductive bar B1z, which is disposed on an upper edge of the first sub-pixel electrode PE1, and a third upper connector C1z, which connects the first sub-pixel electrode PE1 and the third upper conductive bar B1z, and the second sub-pixel electrode PE2 includes a third lower conductive bar B2z, which is disposed on a lower edge of the second sub-pixel electrode PE2, and a third lower connector C2z, which connects the second sub-pixel electrode PE2 and the third lower conductive bar B2z.

The exemplary embodiments of the invention have been described with reference to the accompanying drawings. However, those skilled in the art will appreciate that many variations and modifications can be made to the disclosed embodiments without substantially departing from the principles of the invention. Therefore, the disclosed embodiments of the invention are used in a generic and descriptive sense only and not for purposes of limitation.

What is claimed is:

1. A liquid crystal display device comprising:
   a base unit;
   a pixel electrode disposed on the base unit and including a stem and a plurality of branches, which extend from the stem;
   a first conductive bar extending along a first edge of the pixel electrode, and isolated from the first edge;
   a first connector connecting the pixel electrode and the first conductive bar; and
   a common electrode overlapping the pixel electrode and having a planar shape,
   wherein the first conductive bar and the pixel electrode are both disposed directly on the same layer.

2. The liquid crystal display device of claim 1, wherein the first conductive bar and the pixel electrode are disposed on the same layer and comprise the same material.

3. The liquid crystal display device of claim 1, wherein a distance between the first edge of the pixel electrode and the first conductive bar is about 2 micrometers to about 5 micrometers.

4. The liquid crystal display device of claim 1, wherein a first minimum distance between the first conductive bar and an end of a first branch, which is one of branches of the plurality of branches which face the first conductive bar, differs from a second minimum distance between the first conductive bar and an end of a second branch, which is another one of the branches of the plurality of branches which face the first conductive bar.

5. A liquid crystal display device comprising:
   a base unit;
   a pixel electrode disposed on the base unit and including a stem and a plurality of branches, which extend from the stem;
   a first conductive bar extending along a first edge of the pixel electrode, and isolated from the first edge;
   a first connector connecting the pixel electrode and the first conductive bar; and
   a common electrode overlapping the pixel electrode and having a planar shape,
   wherein a distance between the first edge of the pixel electrode and the first conductive bar changes along a lengthwise direction of the first conductive bar.

6. A liquid crystal display device comprising:
   a base unit;
   a pixel electrode disposed on the base unit and including a stem and a plurality of branches, which extend from the stem;
   a first conductive bar extending along a first edge of the pixel electrode, and isolated from the first edge;
   a first connector connecting the pixel electrode and the first conductive bar; and
   a common electrode overlapping the pixel electrode and having a planar shape,
   wherein the first conductive bar includes a portion whose width changes along a lengthwise direction of the first conductive bar.

7. The liquid crystal display device of claim 1, wherein ends of branches of the plurality of branches which face the first conductive bar are isolated from one another.

8. The liquid crystal display device of claim 7, further comprising:
   a branch connector connecting ends of branches of the plurality of branches which do not face the first conductive bar.

9. A liquid crystal display device comprising:
   a base unit;

a pixel electrode disposed on the base unit and including a stem and a plurality of branches, which extend from the stem;

a first conductive bar extending along a first edge of the pixel electrode, and isolated from the first edge;

a first connector connecting the pixel electrode and the first conductive bar; and a common electrode overlapping the pixel electrode and having a planar shape, wherein the liquid crystal display device further comprises:

a second conductive bar extending along a second edge of the pixel electrode, which is opposite to the first edge, and isolated from the second edge; and a second connector connecting the second conductive bar and the pixel electrode.

10. The liquid crystal display device of claim 9, wherein ends of branches of the plurality of branches which face the second conductive bar are isolated from one another.

11. A liquid crystal display device comprising:

a base unit;

a pixel electrode disposed on the base unit and including a stem and a plurality of branches, which extend from the stem;

a first conductive bar extending along a first edge of the pixel electrode, and isolated from the first edge;

a first connector connecting the pixel electrode and the first conductive bar; and a common electrode overlapping the pixel electrode and having a planar shape, wherein the liquid crystal display device further comprises:

a gate line disposed on the base unit and extending in a first direction; and a first data line disposed on the base unit, insulated from the gate line, and extending in a second direction, which intersects the first direction, wherein the first conductive bar extends in the second direction and does not overlap the pixel electrode and the first data line.

12. The liquid crystal display device of claim 11, further comprising:

a second data line disposed on the base unit, insulated from the gate line, and extending in the second direction;

a second conductive bar extending along a second edge of the pixel electrode, which is opposite to the first edge, and isolated from the second edge; and a second connector connecting the second conductive bar and the pixel electrode, wherein the second conductive bar extends in the second direction and does not overlap the pixel electrode and the second data line.

13. The liquid crystal display device of claim 11, further comprising:

a sustain electrode line disposed on the base unit and overlapping the first conductive bar.

14. The liquid crystal display device of claim 13, wherein the sustain electrode line does not overlap the first edge of the pixel electrode.

15. The liquid crystal display device of claim 13, further comprising:

a second conductive bar extending along a second edge of the pixel electrode, which is opposite to the first edge, and isolated from the second edge; and a second connector connecting the second conductive bar and the pixel electrode, wherein the sustain electrode line overlaps the second conductive bar.

16. The liquid crystal display device of claim 15, wherein the sustain electrode line does not overlap the first and second edges of the pixel electrode.

17. The liquid crystal display device of claim 13, wherein the sustain electrode line is disposed on the same layer as that on which the gate line is disposed, and comprises the same material as that of the gate line.

18. The liquid crystal display device of claim 11, further comprising:

a shielding electrode disposed on the first data line and overlapping the first data line and isolated from the pixel electrode and the first conductive bar.

19. The liquid crystal display device of claim 18, wherein the shielding electrode, the first conductive bar, and the pixel electrode are disposed on the same layer and comprise the same material.

20. The liquid crystal display device of claim 18, wherein voltages of the same level are applied to the shielding electrode and the common electrode.

* * * * *